United States Patent

Hayama et al.

[11] Patent Number: 6,051,448
[45] Date of Patent: *Apr. 18, 2000

[54] METHOD OF MANUFACTURING AN ELECTRONIC COMPONENT

[75] Inventors: Masaaki Hayama, Nara; Noboru Mouri, Katano; Tetsu Murakawa, Neyagawa; Hayami Matsunaga, Hirakata; Masayuki Mizuno, Osaka, all of Japan

[73] Assignee: Matsushita Electric Industrial Co., Ltd., Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/870,344

[22] Filed: Jun. 6, 1997

[30] Foreign Application Priority Data

Jun. 11, 1996 [JP] Japan ................................. 8-148814

[51] Int. Cl.⁷ ..................... H01L 21/483; H01L 21/56; H01L 21/58; H01L 21/60
[52] U.S. Cl. .................. 438/108; 438/611; 438/616; 438/622; 438/623; 438/662; 438/670; 438/977
[58] Field of Search ..................... 438/611, 616, 438/622, 623, 108, 662, 670, 977, FOR 342, FOR 343, FOR 348, FOR 363, FOR 375, FOR 395, FOR 455, FOR 485, FOR 489

[56] References Cited

U.S. PATENT DOCUMENTS 3,621,564  11/1971  Tanaka et al. .
3,719,981   3/1973  Steitz .
4,857,482   8/1989  Saito et al. .
5,106,461   4/1992  Volfson et al. .
5,546,375   8/1996  Shimada et al. .
5,643,831   7/1997  Ochiai et al. .

FOREIGN PATENT DOCUMENTS 2-30140    1/1990  Japan .
4-221674   8/1992  Japan .
4-240792   8/1992  Japan .
6-5608     1/1994  Japan .
6-124953   5/1994  Japan .
6-267963   9/1994  Japan .

*Primary Examiner*—David Graybill
*Attorney, Agent, or Firm*—Ratner & Prestia

[57] ABSTRACT

In a method of manufacturing an electronic component for forming a conductor pattern on an insulating substrate by transfer method employing intaglio printing technique, this manufacturing method comprises a step of fabricating an intaglio 20 made of flexible resin forming an insulating layer 23 on a groove 21, a step of filling the groove 21 with Ag paste 24 and drying, a step of overlaying the intaglio 20 on an insulating substrate 2 having a water-soluble resin 28 formed on the surface by pressing a pressing portion 26, freezing, peeling off the intaglio 20 and insulating substrate 2, and transferring the pattern of the Ag paste 24, and a step of firing it and forming a conductor pattern.

24 Claims, 9 Drawing Sheets

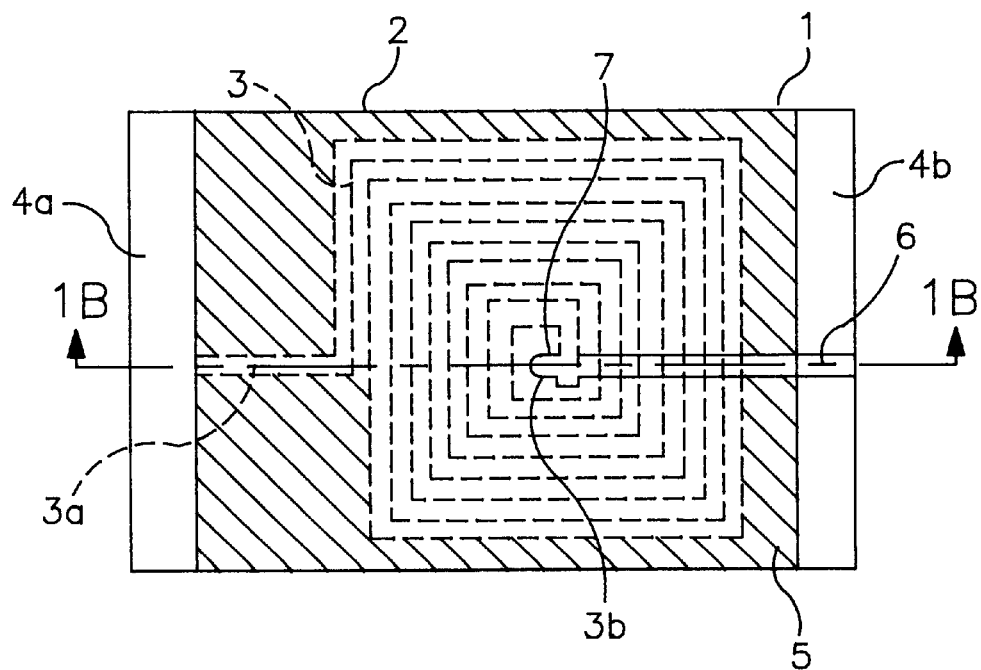
FIG. IA
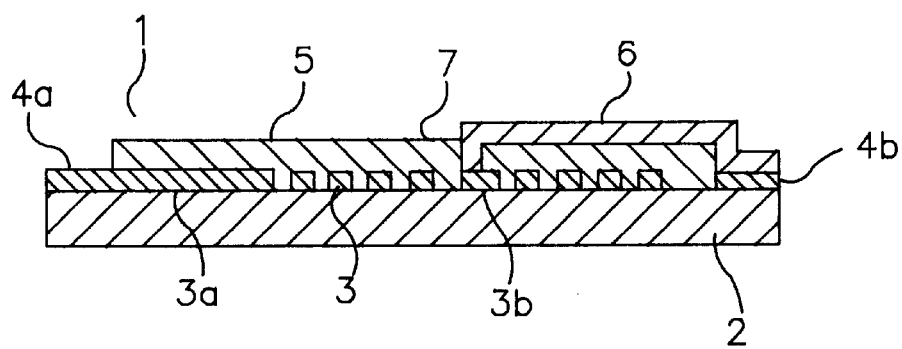
FIG. IB

METHOD OF MANUFACTURING AN ELECTRONIC COMPONENT

BACKGROUND OF THE INVENTION

The present invention relates to a method of manufacturing an electronic component to be used in various electronic appliances, and more particularly to a method of manufacturing an electronic component manufactured by intaglio printing.

Recently, electronic appliances are reduced in size, and hence electronic components used in such electronic appliances are also promoted in downsizing. In such background, the conductor patterns of electronic components are requested to be finer in the conductor lines (hereinafter lines for short) for composing patterns, greater in the film thickness of conductor film for composing the conductor patterns for lowering the line resistance, and laminated in structure for reducing the size.

Conductor patterns of conventional electronic components were formed by printing patterns of conductive paste such as silver paste and copper paste on a substrate as a forming object by printing method such as screen printing and intaglio printing, and firing it. For example, as an application of intaglio printing method, in a printing method as disclosed in Japanese Laid-open Patent Publication No. 4-240792, the intaglio corresponding to the conductor pattern to be formed is filled with conductive paste (organic metal ink), the conductive paste is dried and cured, and the pattern is transferred onto the forming object of substrate through a setting resin, so that the desired conductor pattern is formed.

Moreover, in the hybrid IC, thermal head or transparent electrode, since the width of each line and line interval in the conductor pattern are very small, the method making use of thin film forming and etching is often employed. In this method, first, a thin film of conductive material such as gold, aluminum, and ITO (indium tin oxide) is formed on the substrate by vapor deposition or sputtering, and successively a mask pattern corresponding to a desired conductor pattern is formed by photolithography using a photosensitive resin. Consequently, etching the thin film of conductor material by using etchant and mask pattern, the photo-sensitive resin is finally removed, and the conductor pattern is formed.

In such conventional manufacturing method, however, the following problems are involved.

First, the conventional screen printing method is relatively inexpensive in equipment and is small in the number of requiring manufacturing steps. It is, however, difficult to form fine conductor patterns, and it is extremely difficult to define the line width at less than 70 $\mu$m or reduce the line pitch below 150 $\mu$m. In screen printing, moreover, since the conductor pattern is printed uniformly, height difference (line height difference) cannot be formed in the pattern depending on the design requirements.

Next, the conventional intaglio printing can form fine conductor patterns with the line width of about 50 $\mu$m and line pitch of about 100 $\mu$m, but it is hard to form a conductor film having thickness of 5 $\mu$m or more. It is therefore limited to reduce the electric resistance of the conductor.

Incidentally, to achieve a desired high density of electronic components, it may not be enough by reducing the size of conductor pattern of each layer, and it may be required to form in a laminate structure. Such laminate structure has multiple layers of sandwich structure composed of lower layer conductor pattern, insulating layer, and upper layer conductor pattern. In this case, it is necessary to form via holes for connecting the conductor patterns of upper layer and lower layer, and as the size of the conductor pattern is reduced, via holes must be also reduced in size. However, in the conventional printing methods including the printing method disclosed in the above Publication No. 4-240792, it is extremely difficult to form very fine via holes with diameter of less than 100 $\mu$m. Moreover, in order to achieve reliable electric connection between the conductor patterns of upper layer and lower layer, it is needed to form an electrode (called via hole electrode) for connecting the upper layer and lower layer in the inside of the via hole. In the conventional methods, however, if fine via holes of less than 100 $\mu$m in diameter be formed, it is extremely difficult to form an electrode inside of the via hole of such small size.

In the conventional intaglio printing, generally, the intaglio made of stiff material such as glass and silicon wafer is used. In this case, in the step of transferring the conductor pattern on the forming object, such as ceramic or glass substrate through a setting resin, if attempted to peel off the adhered intaglio and forming object, the intaglio is hardly deformed. Accordingly, the intaglio and forming object adhering on both sides must be peeled off, and a strong peeling force is needed. To solve this problem, a metal sheet may be used for the intaglio so that the intaglio may be flexible. Even in such a case, the pattern shape processing of intaglio (groove forming) is done by wet etching, but this etching is isotropic etching. It is hence impossible to process the intaglio of high aspect ratio necessary for forming conductor pattern of thick conductor film (that is, tall line height) for the line width.

Besides, when forming the conductor pattern by firing the pattern formed of conductive paste material on the forming object such as ceramic or glass substrate through a setting resin, the thickness of the setting resin is required to be 4 $\mu$m or more. At this time, the setting resin generates combustion gas while the temperature is being raised in the firing process, and the pattern deformation occurs. As a result, in the conventional intaglio printing, the dimensional accuracy is not achieved.

On the other hand, the conductor pattern forming method making use of photolithography is effective for forming patterns of small area in a line width of several microns or less as in the semiconductor technology. However, in the formation of conductor pattern used in electronic components such as inductors, it is generally required to form a pattern of a relatively wide area. In such a case, a series of steps including vapor deposition of conductive film, application of resist, exposure, development, etching, and resist removal must be done by using large-sized equipment. As a result, the equipment becomes expensive, and the manufacturing cost increases.

SUMMARY OF THE INVENTION

The invention is devised to solve the above problems, and it is a first object thereof to present a method of manufacturing an electronic component capable of forming a fine conductor pattern containing a via hole electrode of nearly same size as the line width, with the line width of conductor pattern being 10 $\mu$m or less and thickness of conductive film being 5 $\mu$m or more, precisely, at low cost and at high reliability. It is a second object thereof to present a method of manufacturing an electronic component capable of varying the thickness of a conductor film at an arbitrary position of conductor pattern from other position so as to have a height difference in the conductor pattern, depending on the design requirement of conductor pattern. It is a third object thereof to present a method of manufacturing an electronic component capable of laminating conductor patterns having such features.

To achieve the objects, a method of manufacturing an electronic component of the invention comprises a step of manufacturing an intaglio by forming a groove pattern corresponding to a conductor pattern on the surface of a flexible resin, a step of forming a peeling layer for the ease of peeling of substrate and intaglio on the surface of the intaglio, a step of filling the groove with conductive paste, a step of drying the conductive paste, a step of refilling with additional conductive paste to compensate for the loss of volume by drying of the conductive paste decreased in the drying step, a step of repeating the step of re-drying the conductive paste after refilling for a specified number of times, a step of gluing the intaglio and substrate by overlaying the intaglio and substrate through either one of water and water-soluble resin, and freezing either one of water and water-soluble resin by applying temperature in a specific range and pressure in a specific range, a step of peeling the intaglio off the substrate in frozen state and transferring the pattern of the conductive paste on the substrate, and a step of firing the transferred pattern of conductive paste to form a conductor pattern. According to this manufacturing method, an electronic component having a fine conductor pattern including a via hole electrode of nearly same size as the line width, with the line width of 10 µm or less and line thickness of 5 µm or more can be manufactured.

Moreover, by forming a part of the groove formed in the intaglio deeper than in other parts, an electronic component differing in the thickness of the conductor pattern at a specified position can be manufactured.

Still more, in the manufacturing method further comprising a step of forming an insulating layer for covering a part of the conductor pattern formed by the above method (hereinafter called first conductor pattern), a step of forming a second conductor pattern on the surface of this insulating layer, and a step of forming an electrode for electrically connecting the first conductor pattern and second conductor pattern, in the portion not covered with the insulating layer of the first conductor pattern, an electronic component having a laminate structure may be obtained easily.

BRIEF DESCRIPTION OF THE DRAWINGS

FIG. 1(a) is a schematic plan view of a chip inductor in a first embodiment of the invention, and FIG. 1(b) is a sectional view along line 1B—1B in FIG. 1(a).

PREFERRED EMBODIMENTS OF THE INVENTION

Figure 2:
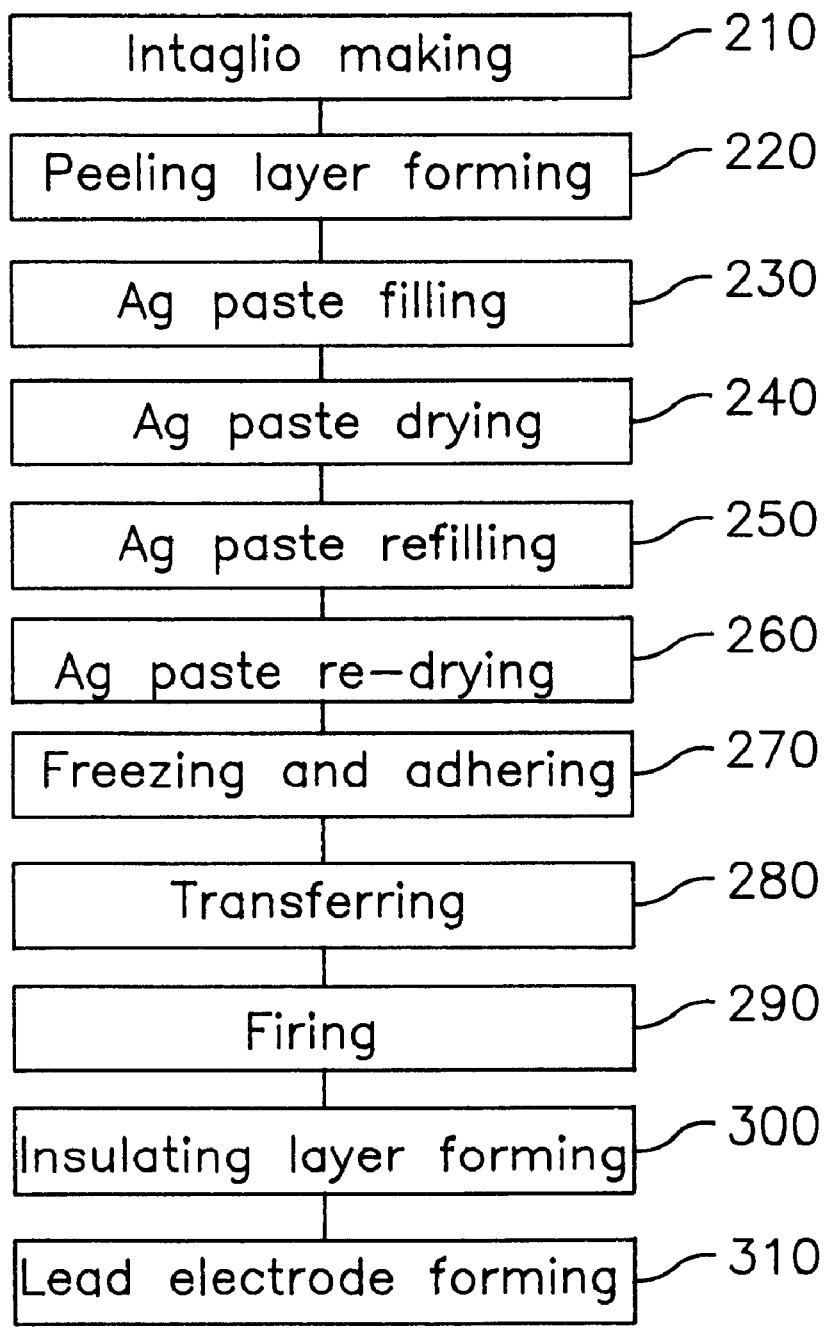
FIG. 2 is a block diagram showing a flow of manufacturing process of electronic component of the invention.

A first embodiment of a method of manufacturing an electronic component of the invention is described below by reference to FIG. 1 through FIG. 9, relating to an example of manufacturing method of chip inductor for high frequency. In the following drawings, same constituent elements are identified with same reference numerals.

A chip inductor 1 has a spiral coil conductor (line) 3 formed on the surface near the center of an insulating substrate 2 of 2.0 mm×1.25 mm, and terminal electrodes 4a and 4b formed at both edges of the insulating substrate 2. An outer end 3a of the coil conductor 3 is connected to one terminal electrode 4a. An inner end 3b of the coil conductor 3 is connected to other terminal electrode 4b through a lead electrode 6 and a via hole electrode 7. The lead electrode 6 is formed on the surface of an insulating layer 5 formed on the insulating substrate 2 so as to cover the coil conductor 3. The via hole electrode 7 connects the lead electrode 6 existing on the surface of the insulating layer 5 and the coil conductor 3 existing beneath the insulating layer 5.

The chip inductor 1 is manufactured in the intaglio printing method as explained below. Steps 210 to 310 explained below are shown in a block diagram in FIG. 2.

Figure 3:
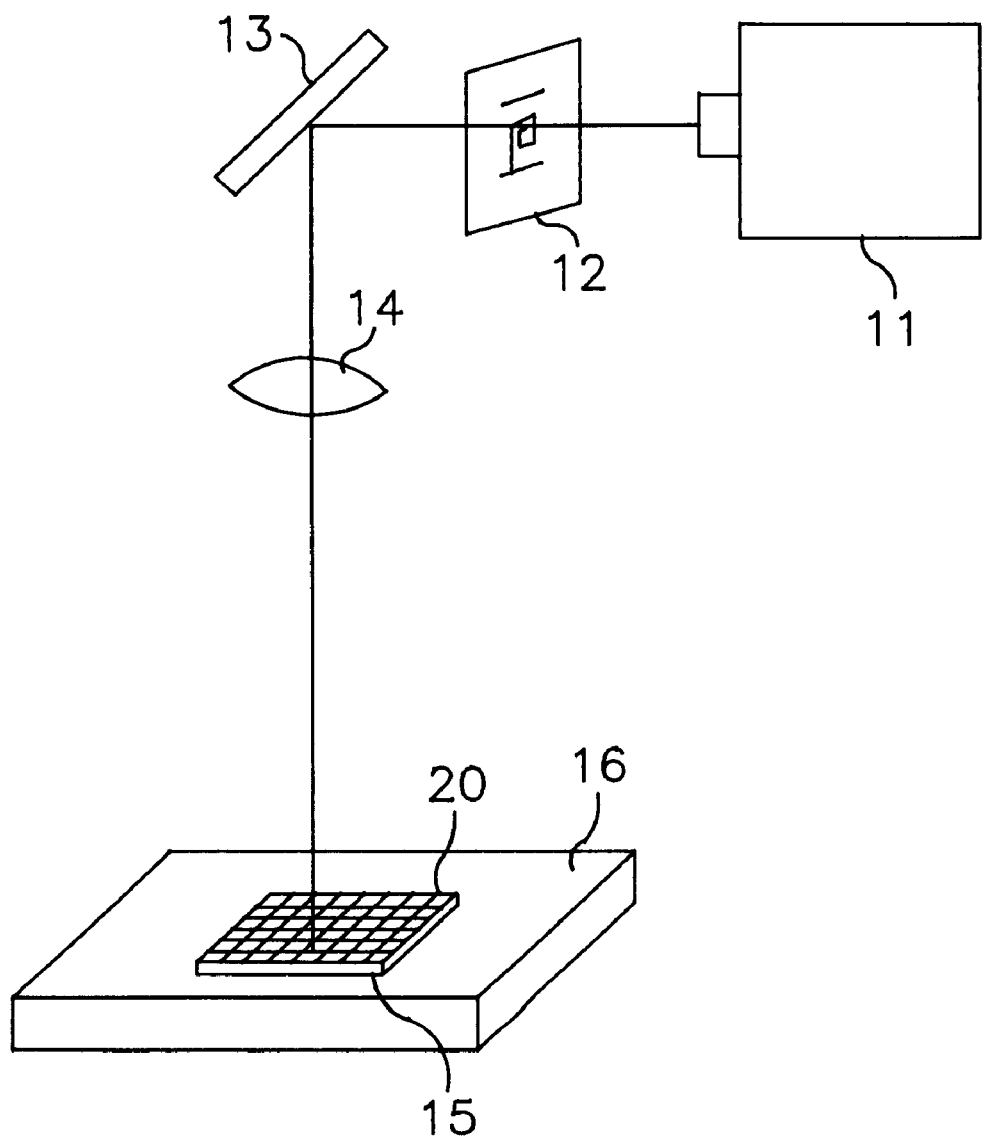
FIG. 3 is a schematic outline diagram showing manufacturing process of intaglio in its manufacturing process.

Referring first to FIG. 3, a manufacturing step 210 of intaglio 20 to be used is described. The intaglio 20 is formed on a polyimide film 15 of 125 µm in thickness formed on an XY stage 16. A laser beam of wavelength of 248 nm in an ultraviolet ray region emitted from an excimer laser device 11 illuminates a mask 12 having a mask pattern corresponding to the spiral pattern of the coil to be formed and the pattern of terminal electrode. The laser beam after passing through the mask 12 is reflected by a mirror 13, reduced by an imaging lens 14, and emitted on the polyimide film 15. The portion of the polyimide film 15 illuminated with the laser beam is decomposed by photochemical reaction, and a groove 21 (see FIG. 4) corresponding to the line of the conductor pattern is formed. As a result, the intaglio 20 corresponding to the desired pattern is formed. By repeating the same illumination operation by moving the XY stage 16, typically, a total of 4000 intaglios 20 in the size of 2.0×1.25 mm are formed on the polyimide film 15 of 100 mm×100 mm.

Whereas the processing by carbon dioxide laser and YAG laser is processing by pyrolysis by the laser beam in the infrared wavelength region, processing by excimer laser is processing by photolysis by the laser beam in the ultraviolet wavelength region in which the peak power reaches up to scores of megawatts. Since processing by excimer laser is short in the pulse width of laser beam, thermal effects on the surroundings except for the processing region are small. Accordingly, the processing by excimer laser is preferred because fine processing with the pattern line width of 10 µm or less is realized.

Moreover, the surface of the polyimide film 15 illuminated with the laser beam is in a very chemically activated sate as the bonding of molecules for composing the film is cut off. Therefore, chemical bonding is likely to occur in this portion. This feature is advantageous for forming the peeling layer described later.

Figure 4:
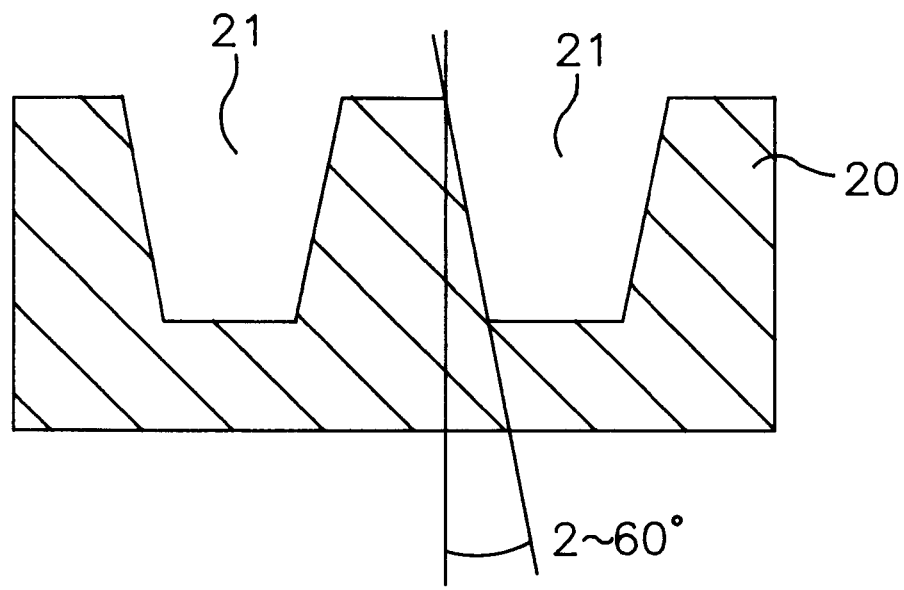
FIG. 4 is a schematic sectional view of groove on the intaglio surface.

FIG. 4 shows a typical sectional shape of the groove 21 of the intaglio 20 formed in the above method. By properly adjusting the characteristics of the optical system used in the laser processing process, such as the focal depth of the lens, preferably, the groove 21 should be formed in a trapezoidal sectional shape having a taper angle of 2 to 60° on the side. Accordingly, in a later process, it is easy to transfer the conductive paste charged inside the groove 21 onto the forming object. The shape of the laser beam to be used is, typically, a rectangular form of 8 mm×24 mm at the exit point from the excimer laser device 11, and is a rectangular form of 3.2 mm×9.6 mm at the point of emission to the polyimide film 15.

It is preferred to form a proper protective film on the processing surface of the polyimide film 15 as the material for the intaglio 20. As a result, the processing surface of the intaglio 20 can be protected from the interaction with the plasma generated when forming the groove 21, and deformation of the opening of the groove 21 of the surface of the intaglio 20 can be prevented. As the material of the protective layer for this purpose, for example, it is preferred to use polyethylene terephthalate (PET), polycarbonate (PC), or polysulfone (PSF).

Consequently, replacing the mask 12 with a mask for forming the via hole electrode 7, the laser beam is further emitted, and a circular pit 22 (see FIG. 5) corresponding to the via hole electrode 7 is formed at a specified position of the groove 21 of the conductor pattern formed in the preceding process. When forming the pit 22, fine processing is possible same as when forming the groove 21, and it is preferred that the pit 22 should have a taper shape for the ease of transfer of the charged conductive paste. Meanwhile, it is also possible to form the pit 22 having other shape than the cylindrical shape.

In this method is formed the intaglio 20 comprising the groove 21 of 20 $\mu$m in depth corresponding to the line of the conductor pattern of 10 to 50 $\mu$m in width, and the pit 22 of 60 $\mu$m in diameter corresponding to the via hole electrode of 45 $\mu$m in diameter. The depth of the groove 21 and pit 22 can be freely changed in the units of 0.2 $\mu$m without having to change the width of the line (width of the groove 21) by varying only the irradiation time of the laser beam, so that an optimum value may be obtained. Incidentally, the width of the groove 21 and the diameter of the pit 22 may be easily adjusted by changing the dimensions of the mask. According to the method of the invention, the line width of the conductor pattern can be defined to be less than 10 $\mu$m, or the size of the via hole may be reduced to correspond to such fine line.

As the material for the intaglio 20, it is preferred to use polyimide film 15. As a result, the intaglio 20 may have flexibility. The effects obtained as a result are described below.

Using the intaglio 20 formed in this method, a conductor pattern is formed on the substrate or the forming object. However, the polyimide film 15 used as the material for the intaglio 20 is not sufficient in peeling from the conductive paste charged and transferred in the groove 21 and pit 22. Accordingly, in the transfer process, the conductive paste is likely to be left over in the groove 21 and pit 22. In particular, in the pit 22 corresponding to the via hole electrode 7, since the depth is great, remainder of conductive paste occurs very notably. As a result, the shape of the intaglio 20 may not be transferred sufficiently. Therefore, to realize transfer of substantially perfect intaglio shape, a forming step 220 of peeling layer on the surface of the intaglio 20, in particular, the surface of the groove 21 and pit 22 is necessary.

To solve this problem, the present inventors intensively studied the peeling process of the polyimide film 15 from the viewpoint of peeling strength from the conductive paste and the life of the processing layer, in particular. As a result, it was found particularly effective to form the peeling layer of fluorocarbon monomolecular film in the following method.

First, oxygen plasma is emitted to the surface of the intaglio 20 by plasma ashing apparatus, and the density of the oxygen remaining on the surface of the intaglio 20 is increased. On the other hand, in a mixed solution of 80% of n-hexadecane (or toluene, xylene or dichlorohexyl), 10% of carbon tetrachloride, and 8% of chloroform, a nonaqueous solvent mixing a substance containing fluorocarbon group and chlorosilane group, for example, $CF_3(CF_2)_7$ $(CH_2)_2SiCl_3$, is dissolved at a concentration of about 1%, and a solution is prepared. In this solution, the intaglio 20 thus treated in oxygen is immersed, and an oxide film is formed on the surface of the intaglio 20. Multiple hydroxyl groups are contained on the surface of this oxide film, and they react with SiCl group of the substance containing fluorocarbon group and chlorosilane group, and dechlorination reaction takes place. As a result, fluorocarbon monomolecular film chemically adsorbed by covalent bond on the surface of the intaglio 20 is formed on the entire surface of the intaglio 20. This monomolecular film functions effectively as the peeling layer 23 (see FIG. 5).

The position requiring a large peeling force when peeling is mainly the portion of the groove 21 and pit 22, and the peeling layer 23 is preferred to be formed mainly in such area. On the other hand, as mentioned above, of the polyimide film 15 for composing the intaglio 20, the portion forming the groove 21 and pit 22 by excimer laser processing is in a chemically active state. As a result, the peeling layer 23 of the fluorocarbon monomolecular film is bonded and formed more inside of the groove 21 and pit 22 requiring a large peeling force when peeling. The bonding between the peeling layer 23 and intaglio 20, that is, the monomolecular film and the polyimide film 15 is covalent bond, and the both are bonded very strongly, and the durability of the peeling effect is excellent. Moreover, the thickness of the peeling layer 23 is as thin as 100 to 1000 angstroms, so that the inside of the intaglio 20 may be filled with much conductive paste without having effects on the shape precision of the intaglio 20. Thus, the peeling layer 23 formed on the surface of the intaglio 20 at step 220 has excellent properties in many aspects.

Figure 5:
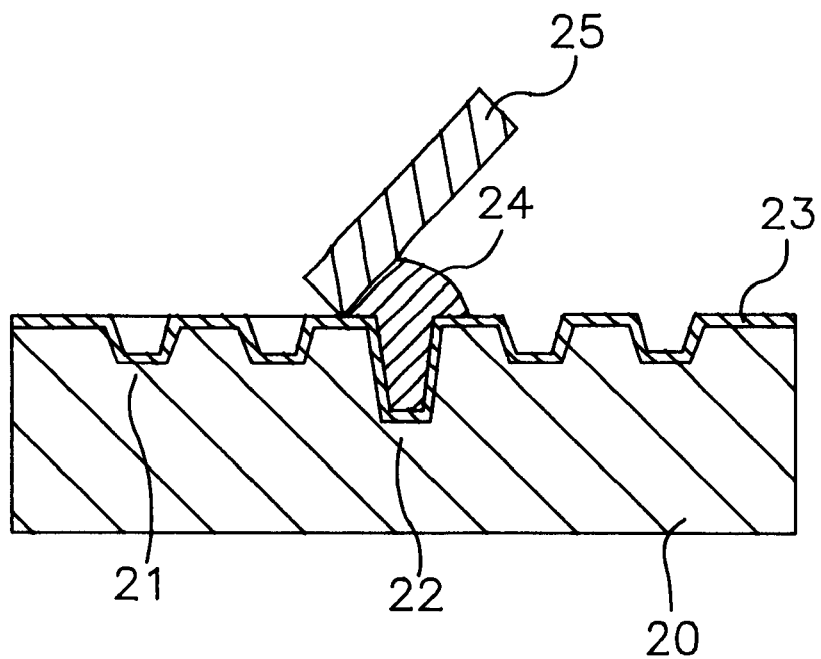
FIG. 5 is a schematic out-line diagram of filling process of conductor paste in the intaglio.

At step 230, consequently, Ag paste 24 is applied as conductive paste on the surface of the intaglio 20 in which the peeling layer 23 is formed. Then, as shown in FIG. 5, by scratching the surface of the intaglio 20 after application by a squeegee 25, extra Ag paste 24 on the surface of the intaglio 20 can be removed, and the inside of the groove 21 and pit 22 is filled with Ag paste 24 sufficiently. The material of the squeegee 25 used herein is preferred to be ceramic owing to the following reason. That is, in the case of resin or steel made squeegee, the squeegee surface is likely to be flawed by the foreign matter contained in the Ag paste 24 or dust present on the surface of the intaglio 20. As a result, the surface of the intaglio 20 may be damaged by the flaw on the squeegee surface, and the life of the intaglio 20 may be shortened. In the case of ceramic made squeegee 25, by contrast, since it is rigid, its end is hardly damaged by foreign matter or dust. Moreover, when the end of the ceramic squeegee 25 is polished by a fine abrasive of roughness of 2000 or more, wear due to long-term abrasion may be avoided. As a result, the ceramic squeegee hardly damages the surface of the intaglio 20.

Next, the intaglio 20 filled with Ag paste 24 is dried by using a circulation type hot air dryer, and the organic solvent in the Ag paste 24 is evaporated (step 240). Thus, the Ag paste 24 filling the groove 21 and pit 22 in the intaglio 20 is fitted to the shape of the groove 21 and pit 22, so that a sharper shape may be formed. The drying means is not limited to the one shown above only.

On the surface of the intaglio 20 used in the embodiment, relatively deep groove 21 and pit 22 are formed, and in particular the maximum depth of the pit 22 is as much as 60 $\mu$m. Accordingly, in this drying step 240, if the intaglio 20 is dried quickly at temperature over 100° C., pin holes of 5 to 40 $\mu$m in diameter are likely to be formed in the Ag paste 24 charged in the groove 21 and pit 22. In the fine conductor pattern with the line width of 50 $\mu$m or less, such pin holes may cause open failure after pattern firing, thereby impeding forming of favorable conductor pattern. Hence, in the drying step 240, it is preferred to dry the intaglio 20 in step stages as shown below. First, at temperature of 100° C. or less, preliminary drying is continued for 5 minutes, and at 150° C., drying is done for 5 minutes. In this two-stage drying, forming of pin holes may be prevented, and a conductor pattern free from open failure after firing is formed.

Instead of such preliminary drying, by raising temperature from room temperature to 150° C. by a moderate temperature gradient of 15° C./min or less, an inhibitory effect of formation of pin holes may be also obtained.

If, incidentally, the Ag paste 24 in the groove 21 or pit 22 is cured by drying at the step 240, its flexibility is likely to be lost. As a result, when transferring the conductor pattern having a fine line width (for example, 100 $\mu$m or less), cracks may be formed in the Ag paste 24 due to stress occurring at the time of transfer, which may lead to occurrence of open failure when firing. To avoid such inconvenience, it is preferred to add 0.1 to 10 wt. % of plasticizer in the Ag paste 24. Hence, the Ag paste 24 has an adequate flexibility after drying, and crack in the transfer step can be prevented. As the plasticizer, it is preferred to use a plasticizer of ester phthalate, for example, dimethyl phthalate, diethyl phthalate, or dioctyl phthalate.

After the drying step 240, the volume of the Ag paste 24 charged inside the groove 21 and pit 22 is decreased by the portion corresponding to the evaporation of the organic solvent. To compensate for this volume decrease, accordingly, the filling step and drying step of the Ag paste 24 are repeated once more. The Ag paste 24 once cured by evaporation of the organic solvent in the preceding drying step 240 is softened again at this refilling step. By this refilling step 250 and re-drying step 260, the shape of the charged Ag paste 24 is further adjusted, and the thickness of the Ag paste 24 may be made equal to the depth of the groove 21 and pit 22 of the intaglio 20.

In the non-pattern forming portion of the intaglio 20, in particular, between grooves 21, if the Ag paste 24 is left over, it may cause short-circuit failure between lines of the conductor pattern. Such residue of Ag paste 24 occurs because the Ag paste 24 is viscous and stringy, and stringiness occurs during the scratching operation by the squeegee 25, so that the Ag paste 24 is left over in the portion to be removed. However, at the refilling step 250, if refilled while the Ag paste 24 in dry state is present in the groove 21 and pit 22, the solvent of the Ag paste 24 newly applied in the non-pattern forming portion is absorbed by the dry paste in the groove 21 or pit 22, and the viscosity of the Ag paste left over in the non-pattern forming portion is increased. As a result, stringiness does not occur when removing the Ag paste 24 in the non-pattern forming portion by the squeegee, and the residual paste in this portion can be easily removed. Thus, a conductor pattern without short-circuit failure between the lines can be obtained.

In this embodiment, the refilling step 250 and re-drying step 260 are repeated once each, but they may be repeated twice or more as required.

Figure 6:
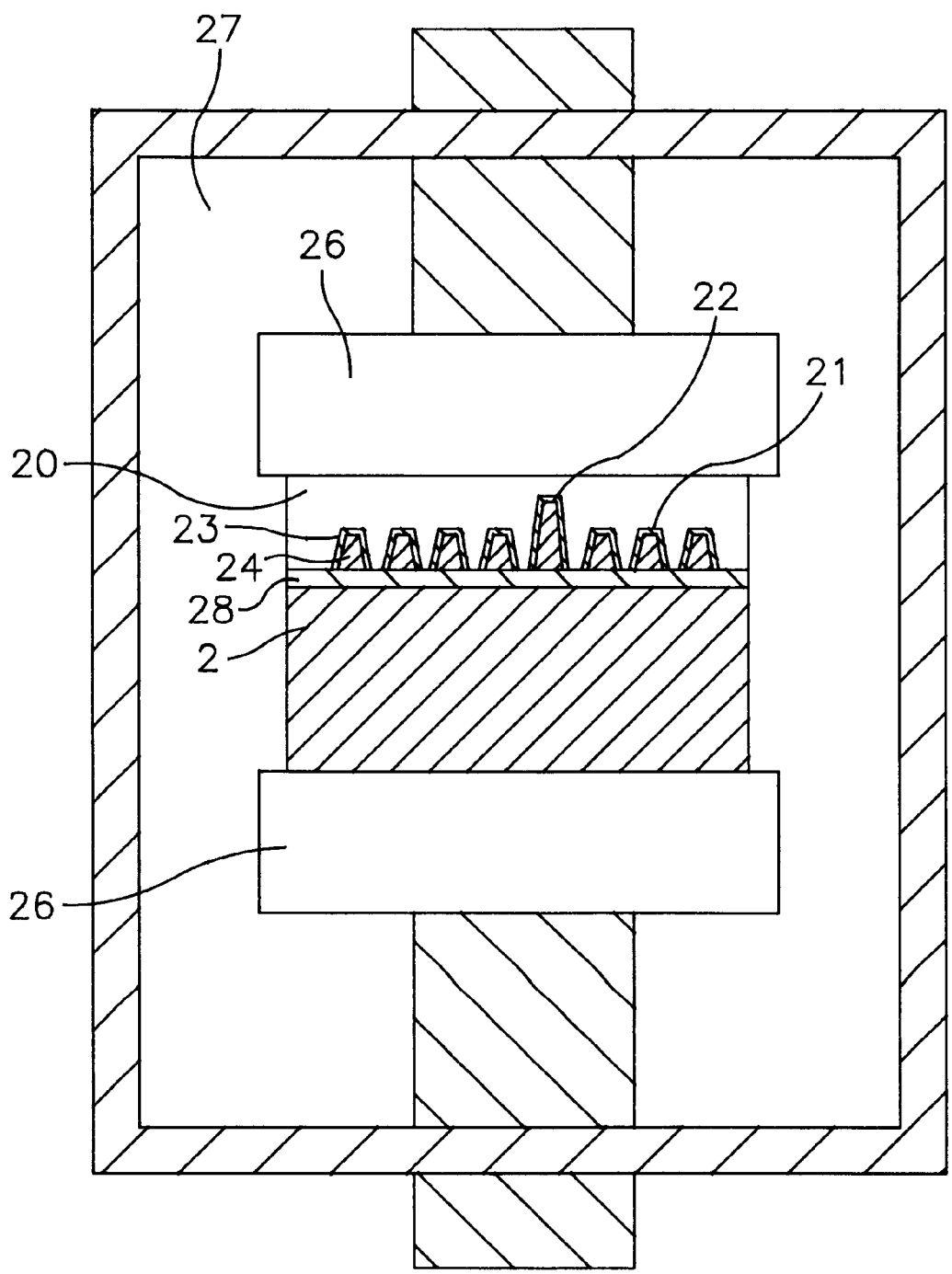
FIG. 6 is a schematic outline diagram of laminate process.

Consequently, a water-soluble resin 28 is formed on the insulating substrate 2. This water-soluble resin 28 functions as adhesion layer when frozen at the time of transfer. As schematically shown in FIG. 6, the surface of the intaglio 20 of the side of the groove 21 and pit 22 filled with Ag paste 24 is set opposite to the water-soluble resin 28, and the intaglio 20 and insulating substrate 2 are adhered together while applying pressure (step 270). The adhering device is in a structure of surrounding a pressing portion 26 of a press device by a freezing device 27 as shown in FIG. 6.

The applied pressure is preferred to be set in a range from the lower limit pressure of 1 kg/cm$^2$ to the upper limit pressure for causing crack of the insulating substrate 2. If the pressure is smaller than the lower limit value, when the surface of the insulating substrate 2 is corrugated, the intaglio 20 and insulating substrate 2 are not fitted perfectly when adhering, and bubbles may get in between them. Such phenomenon may lead to transfer failure.

Considering this result of investigation, in the embodiment, the laminating step 270 is conducted in the following condition. First, the water-soluble resin 28 dissolving polyvinyl alcohol (PVA) is applied on the surface of a 100 mm square alumina-made insulating substrate 2. An optimum concentration of the water-soluble resin 28 is in a range of 1 to 50 wt. % depending on the kind of resin, and 15% was optimum concentration for PVA. Next, the insulating substrate 2 thus coated with water-soluble resin 28 of PVA, and the intaglio 20 filled with Ag paste 24 are adhered together in the condition of temperature of −40° C. and pressure of 20 kg/cm$^2$ by using the press device in a structure of surrounding the pressing portion 26 with the freezing device 27. In this embodiment, the water-soluble resin 28 is applied on one side only of the insulating substrate 2 and only one side is adhered, but the water-soluble resin 28 may be applied on both sides of the insulating substrate 2, and both sides may be adhered.

Usually, the surface of the insulating substrate 2 has corrugations of about 30 $\mu$m in maximum width as schematically shown in FIG. 7(*a*) or FIG. 7(*b*). In the case of the conventional glass intaglio 29 shown in FIG. 7(*b*), since the rigidity of the glass intaglio 29 is too strong, the intaglio 29 cannot sufficiently follow up the corrugated shape of the insulating substrate 2. Hence, the thickness of the water-soluble resin 28' must be made non-uniform at about 10 to 50 $\mu$m, and lamination must be executed by absorbing the corrugation. As a result, due to uneven film thickness of the water-soluble resin 28', partial pattern deformation occurs. On the other hand, in the case of the flexible resin intaglio 20 as in this invention, as shown in FIG. 7(*a*), the intaglio 20 can sufficiently follow up the corrugated shape of the insulating substrate 2. Therefore, regardless of the corrugated shape of the insulating substrate 2, the water-soluble resin 28 of uniform film thickness can be formed on the insulating substrate 2, and partial pattern deformation due to uneven film thickness can be avoided.

Next, as transfer step 280, the laminated intaglio 20 and insulating substrate 2 are set below 0° C. temperature so that the water-soluble resin 28 may be frozen, and in this state the intaglio 20 is peeled off from the insulating substrate 2, and the Ag paste 24 is adhered to the insulating substrate 2 by the cohesive force of ice, and the conductor pattern is transferred. At this time, since the intaglio 20 is rich in flexibility, as shown in FIG. 8, the intaglio 20 can be bent at an angle of 90° or more. As a result, peeling of the intaglio 20 from the insulating substrate 2 is peeling of surface and line. Accordingly, the required peeling force is decreased, so that the intaglio 20 can be peeled off easily. On the other hand, in the case of the conventional rigid glass intaglio 29 (see FIG. 7(b)), the intaglio 29 cannot be bent to the angle as shown in FIG. 8. It is therefore peeling of surface and surface, and a large peeling force is needed. Or if the bending angle of the intaglio 29 is too large, cracks may be easily formed in the intaglio 29 or insulating substrate 2. In the conventional case, therefore, greater care is needed in peeling of the two, the working efficiency is poor, which caused to increase the working cost and working time.

In the transfer step of the invention, if using the intaglio 20 having a pattern of, for example, groove width of 15 $\mu$m and depth of 20 $\mu$m, the Ag paste 24 is not left over inside the groove 21, and the conductor pattern having the width substantially same as the width of the groove 21 and the height substantially same as the depth of the groove 21 can be transferred and formed. In the viahole electrode portion, when the diameter of the pit 22 of the intaglio 20 is 45 $\mu$m and the depth is 60 $\mu$m, same as in the case of the groove 21, the conductor pattern of the dimensions substantially corresponding completely can be transferred and formed. Besides, since the conductor line and via-hole electrode are integrally formed at the same time in the same process, the electrical connection of the two is securely assured.

Moreover, in the case of the electronic component used in high frequency region such as the chip inductor 1 for high frequency in the embodiment, the surface shape of the conductor pattern must be as sharp as possible in order to decrease the superficial resistance and enhance the electrical operation characteristic. However, in the wet etching process used in forming the conventional steel plate or glass intaglio, processing of high aspect ratio is impossible because of isotropic etching. Accordingly, as the pattern becomes fine and the forming line width is narrow, deep groove cannot be formed. Besides, the groove edge is not sharp but is round. By contrast, by processing the intaglio 20 by excimer laser as in the invention, a pattern having sharp edges can be formed. As already explained, moreover, since the Ag paste 24 is not left over in the groove 21 or pit 22 at the time of transfer, a pattern having a sharp shape same as the shape of the acute intaglio 20 can be formed. Therefore, the conductor pattern of the embodiment has excellent properties as the conductor for high frequency.

Next, after peeling off the intaglio 20 at temperature of 0° C. or less, drying is conducted by a dryer at temperature of 150° C. At this time, the moisture in the water-soluble resin 28 is evaporated rapidly, and the adhesion layer becomes an adhesion layer of a minimum required limit of 1 $\mu$m or less for fixing the Ag paste 24 in the insulating substrate 2.

In the process using the conventional thermoplastic resin or thermosetting resin, in order to transfer from the intaglio, the film thickness of the adhesion layer was required by 4 $\mu$m or more. Accordingly, in the later process of firing, thermal changes of adhesion layer, or peeling or deformation leading to defect of conductor pattern by combustion gas took place. In the invention, however, since a strong adhesion force is needed in the peeling stage, the cohesive force by freezing the moisture in the water-soluble resin 28 is used, and in the firing stage, the moisture is evaporated, and therefore the film thickness of the adhesion layer can be set to the minimum required thickness for fixing the Ag paste 24 on the insulating substrate 2. As a result, peeling and deformation of the conductor pattern can be prevented at the time of firing. Of course, if the drying and firing steps after peeling the intaglio 20 and insulating substrate 2 are in a continuous process not causing deformation of the conductor pattern without fixing with the insulating substrate 2, it is not necessarily required to use water-soluble resin in the adhesion layer, and only water may be used.

As the material for the water-soluble resin 28 to be applied on the insulating substrate 2, it is preferred to use ethyl cellulose derivative thermoplastic resin, or epoxy or acrylic thermosetting resin. In particular, PVA, polyvinyl acetal, cellulose ether, methyl vinyl ether and maleic acid anhydride copolymer, and other water-soluble synthetic polymers are preferred, or natural water-soluble polymers such as gelatin and galactose are preferred. These materials can be easily frozen, and adhesion of the conductor pattern to the substrate is strong when firing after transferring to the substrate, and deformation of conductor pattern is less likely to occur.

According to such method of the invention, the lines 3 in the conductor pattern and the via-hole electrode 7 are integrally formed at the same time. Thus, secure electric connection between the lines 3 and the via-hole electrode 7 is achieved.

Next, to form an insulating layer 5 on the surface of the insulating substrate 2 forming the conductor pattern, a glass paste pattern is printed and formed (step 300). At this time, in the portion of the via-hole electrode 7, crystallized glass of viscosity of 200,000 cps is printed by using a screen plate of mask diameter of 150 $\mu$m. Consequently, in the portion of the via-hole electrode 7, printing blur occurs, and the thickness of the glass paste covering the periphery of the via-hole electrode 7 is thinner than in other portions. As a result, a portion of via-hole shape is formed around the via-hole electrode 7. Since the diameter of the via-hole to be formed is defined by the shape of the via-hole electrode 7, fine via-holes of about 40 $\mu$m in diameter hitherto difficult to form can be easily printed and formed. Moreover, since such fine via-holes can be formed, the number of turns of the spiral coil pattern can be increased by the corresponding portion. Hence, the inductance value of the obtained coil pattern can be increased.

Thus printed glass paste pattern is fired by holding at the peak temperature of 820° C. for 10 minutes, and the insulating layer 5 is formed. At this time, since crystallized glass is used, flowing during firing is less, and the printed pattern shape is maintained favorably.

In the conventional method, in order to mutually connect the conductor patterns of upper layer and lower layer of the substrate of multilayer structure, via-holes were formed in the insulating layer by patterning or etching by screen printing, and electrode materials were embedded to form via-hole electrodes. In this method, however, due to defect in the electrode embedding process, imperfect electrical connection between the conductor pattern of upper layer or lower layer and via-hole electrode may occur, and faulty connection may occur between the conductor pattern of lower layer and conductor layer of upper layer. In the method of the invention, however, as mentioned above, since the via-hole electrode 7 is formed integrally and simultaneously with forming of the conductor pattern of the lower layer, such defective connection does not occur. Moreover, the shape and thickness of the via-hole electrode 7 can be set arbitrarily, and by projecting the via-hole electrode 7 by several microns from the surface of the insulating layer 5, the connection of the conductor pattern of the upper layer and the viahole electrode 7 can be achieved securely. Still more, by forming trapezoidally in the sectional shape in the direction vertical to the surface of the insulating substrate 2 of the via-hole electrode 7, even if the via-hole electrode 7 is small in dimension, a sufficient connection strength necessary in the later process can be obtained.

Finally, a lead electrode 6 is formed on the insulating layer 5 at step 310. Herein, by Ag paste, the pattern of the lead electrode 6 is screen printed on the surface of the insulating layer 5, and it is formed by firing by holding at peak temperature of 810° C. for 10 minutes. As a result, the chip inductor 1 of the embodiment is manufactured.

So far is explained the manufacturing method of the electronic component of the embodiment by referring to an example of chip inductor 1, and, of course, such manufacturing method is not limited to the chip inductor 1. For example, the manufacturing method of the invention may be applied to manufacture of other electronic components such as chip beads, EMI filter and capacitor or electrode portion of other electronic components having laminate structure. In the preceding description, after transferring the conductor pattern by the manufacturing process of step 210 to step 290, the insulating layer 5 and lead electrode 6 are formed at step 300 and step 310. However, when forming a conductor pattern not requiring such structure, step 300 and step 310 are not necessary, and the desired conductor pattern may be obtained by step 210 to step 290.

As the material of the conductive paste used for forming the conductor pattern, Ag paste is used, but the invention is not limited to this alone. For example, other metal paste such as Cu, Ni, Al and Au, or resinate paste can be used. Aside from the conductive paste containing organic solvent, it is also possible to use conductive paste containing a proper flexible resin after curing with ultraviolet curing resin or thermosetting resin.

The material of the intaglio 20 is desired to have an adequate flexibility. For example, aside from the polyimide film 15 mentioned above, it is preferred also to use resin sheets such as PET, PSF, PC, PEI (polyether imide), PAR (polyacrylate), or PEEK (polyether ketone).

The material of the insulating substrate 2 as the forming object for transferring and forming the conductor pattern is not particularly limited, and ceramic and other general materials may be employed. By selecting dielectric material, magnetic material, or insulating material for the insulating substrate, various different electronic components may be fabricated. Or, by using the material formed from green sheet as the insulating substrate 2, the parts structure becomes rational.

When forming an inductance part, it is preferred to form at least one of the insulating substrate 2 and insulating layer 5 by using a magnetic material such as ferrite. This is because the inductance value of the formed electronic components can be enhanced by the permeability of these magnetic materials. When composing the capacitor or the like, it is preferred to use a dielectric material. Hence, the capacitance is increased.

For formation of the intaglio 20, it is preferred to the excimer laser device 11, but as far as capable of generating laser beam at the wavelength in the ultraviolet ray region, other laser source such as pigment laser and free electron laser may be used. Moreover, if the light source can generate a beam having an energy density of the necessary level equivalent to these lasers in the same wavelength region, others than the laser light source may be also used.

A second embodiment of manufacturing method of the electronic component in the invention is described below in FIG. 10 through FIG. 13 by referring to an example of manufacturing method of hybrid IC (hereinafter called HIC) substrate having a laminate structure of conductor pattern. In FIG. 10 through FIG. 13, same constituent elements are identified with same reference numerals.

FIG. 10(*a*) is a plan view of an HIC substrate 30, and FIG. 10(*b*) is a cut sectional view of the HIC substrate 30 along line 11B—11B in FIG. 10(*a*). The right half of FIG. 10(*a*) shows the portion of forming the second conductor pattern of the upper layer, and the left half shows the portion of forming the first conductor pattern of the lower layer. Incidentally, FIG. 10(*a*) and FIG. 10(*b*) show the constitution of the HIC substrate 30 simply and schematically, and the conductor pattern in the drawing does not show the following dimensions correctly.

The HIC substrate 30 has a two-layer wiring structure consisting of a first conductor pattern 32 as the lower layer formed on an insulating substrate 31, an insulating layer 33 formed to cover the first conductor pattern, and a second conductor pattern 34 as the upper layer formed on the insulating layer 33. The first conductor pattern 32 comprises a spiral coil conductor portion 32*a* and other conductor portion 32*b* as shown in FIG. 10(*b*). The first conductor pattern 32 and second conductor pattern 34 are connected by a via-hole electrode 35. In part of the first conductor pattern 34, a mounting portion 36 for face-down mounting of the IC chip is provided.

Of the first conductor pattern 32, in the portion corresponding to the coil conductor portion 32*a*, from the viewpoint of electrical characteristic, a conductor pattern is formed, for example, at a pitch of 60 μm (that is, width of 30 μm of each line and line interval of 30 μm) and a height (that is, thickness of conductor film) of 35 μm. The via-hole electrode 35 is formed in a height (that is, thickness of conductor film) of 50 μm, so that the leading end may project from the surface of the insulating layer 33 and the conductor patterns 32 and 34 of upper and lower layers may be connected securely. On the other hand, the face-down mounting portion 36 of the second conductor pattern 34 is formed, for example, in a pitch of 150 μm (that is, width of 75 μm of each line, and line interval of 75 μm). Moreover, this face-down mounting portion 36 is required to have a flatness so that the corrugation per surface length of 5 mm should be 3 μm or less, from the mounting condition restriction of the face-down mounting of the IC chip. In this case, of the first conductor pattern, if the height (thickness of the conductor film) of the conductor portion 32*b* positioned beneath the face-down mounting portion 36 is 5 μm or more, the surface corrosion of the insulating layer 33 becomes large, and face-down mounting is difficult. Accordingly, the height of the conductor portion 32*b* is limited below 5 μm.

Thus, in the second embodiment of the invention, of the formed conductor patterns, the thickness (line height) of the conductor film in an arbitrary position is changed to a desired value, and a conductor pattern having a height difference is formed in the pattern. As a result, the HIC substrate 30 realizing face-down mount of IC chip at a specified position of the second conductor pattern 34 on the surface is formed.

The manufacturing method of the HIC substrate 30 of the embodiment is described below. Meanwhile, the individual steps for manufacturing the intaglio differ only in the shape of the conductor pattern as the forming object, but are substantially equivalent to the corresponding steps in the first embodiment. Therefore, descriptions about their features and the like are omitted herein.

First, the intaglio for forming the first conductor pattern 32 is formed on the polyimide film in the following procedure by using excimer laser, same as in step 210 of the first embodiment, by using three masks, that is, the mask for forming the coil conductor portion 32a of the first conductor pattern 32, the mask for forming the other conductor portion 32b, and the mask for forming the viahole electrode 35. First, using the mask corresponding to the pattern of the coil conductor portion 32a, a pattern corresponding to the coil conductor 32a composed of a groove of 45 μm in depth is formed. Then, using the mask corresponding to the pattern of the via-hole electrode 35, a pattern corresponding to the via-hole electrode composed of a groove of 65 μm in depth is formed. Finally, using the mask corresponding to the pattern of the conductor portion 32b, a pattern corresponding to the conductor portion 32b composed of a groove of 10 μm in depth is formed. By positioning the relative positions of the individual patterns formed in these steps at a precision of within 5 μm, the intaglio for forming the first conductor pattern 32 is formed.

On thus formed intaglio, same as in step 220, a peeling layer composed of fluorocarbon monomolecular film is formed. Then, same as in step 230, each groove of the intaglio is filled with Ag paste by using a ceramic squeegee. Later, same as in step 240, the Ag paste is dried by the circulation hot air type dryer. The organic solvent contained inside is evaporated, and the internal paste of the grooves of the intaglio is decreased by the volume corresponding to the evaporation amount. Moreover, same as in step 250 and step 260, after refilling with Ag paste, drying is executed in two stages. In this way, by repeating paste filling and drying steps same as in the first embodiment, the thickness of the Ag paste film is made substantially equal to the depth of each groove.

Then, same as in step 270, the water-soluble resin is applied on the surface of the insulating substrate 31, and the intaglio and insulating substrate 31 are adhered at pressure of 25 kg/cm$^2$ and substrate temperature of −40° C. Consequently, same as in step 280, the intaglio is peeled off while keeping the substrate temperature below 0° C., the conductor pattern is transferred onto the insulating substrate 31, and dried by a dryer at temperature of 150° C. Further, same as in step 290, the insulating substrate 31 on which the conductor pattern is transferred is fired by raising temperature at a temperature gradient of 30° C./min up to peak temperature of 850° C.

In this series of steps, same as in the first embodiment, the first conductor pattern 32 and via-hole electrode 35 are integrally and simultaneously formed.

Same as in step 300, consequently, a pattern of insulating layer 33 is formed on the insulating substrate 31 by screen printing of color paste. Firing at temperature of 840° C., the insulating layer 33 is formed. At this time, by using crystallized glass same as in the first embodiment, flowing of glass paste is less during firing, and the shape formed by screen printing is held relatively well.

After forming the insulating layer 33, a pattern corresponding to the second conductor pattern 34 is formed by screen printing of Ag paste. The second conductor pattern 34 is formed by firing for keeping at peak temperature of 810° C. for 10 minutes.

In this way, by increasing the height of the line (thickness of the conductor film) in the portion corresponding to the spiral coil conductor portion 32a of the conductor pattern, a coil excellent in electric characteristic is formed same as in the first embodiment. Besides, by forming the section in the direction vertical to the substrate surface of the via-hole electrode 35 in a trapezoidal form, the electric connection between the second conductor pattern 34 and first conductor pattern 32 may be made securely. Still more, by reducing the thickness of the first conductor pattern 32 selectively at desired positions, the surface of the insulating layer 33 can be flattened as necessary positions. As a result, the IC substrate 30 capable of mounting the IC chip with the face down is manufactured.

Figure 10A:
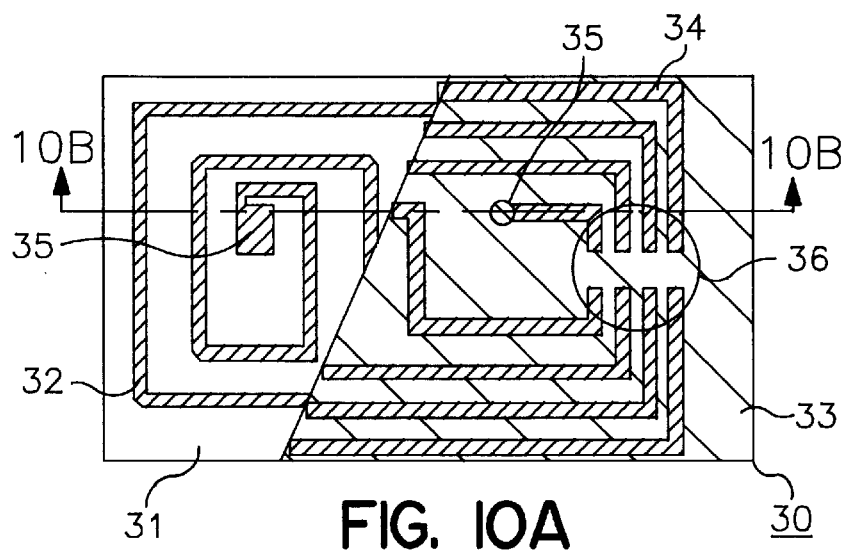
FIG. 10(a) is a schematic plan view of a hybrid IC substrate in a second embodiment of the invention.
Figure 10B:
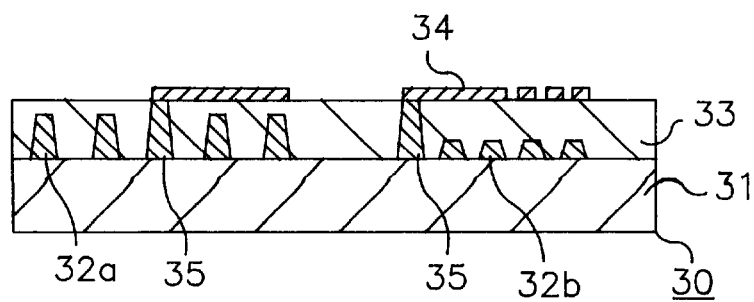
FIG. 10(b) is a sectional view along line 11B—11B in FIG. 10(a).

The shape of the via-hole electrode 35 is not limited to the shape shown in FIG. 10(b). For example, as in an HIC substrate 40 shown in FIG. 11, an electrode 35' may be formed to fill only a part of the via-hole. Or, by forming a via-hole when forming the insulating layer 33, so that the first conductor pattern 32 may not be completely covered by the insulating layer 33, the electrode for connecting the first conductor pattern 32 and second conductor pattern 34 may be provided in the via-hole in other step than the step of forming the first conductor pattern 32.

Figure 11:
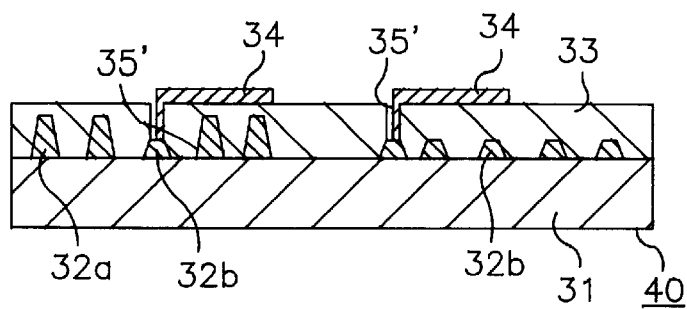
FIG. 11 is a schematic sectional view of other hybrid IC substrate manufacturing a manufacturing method of the invention.

The above explanation relates to an example of two-layer wiring substrate, but a further multiple-layer structure may be also formed. For example, in an HIC substrate 50 shown in FIG. 12, conductor patterns 51, 52, 53 corresponding to pattern of one layer of HIC substrates 30 and 40 shown in FIG. 10(b) and FIG. 11 are laminated in three layers on the insulating substrate 31. Moreover, since a height difference may be formed on the line of the conductor pattern, it is also possible to form an HIC substrate 60 having a surface shape of insulating layer 33 as shown in FIG. 13. In the HIC substrate 60, of the lower layer conductor pattern, the conductor portion 32a corresponding to the portion where control of surface corrugated shape of the insulating layer 33 is not necessary is formed by a relatively high line (a thick conductor film). On the other hand, the conductor portion 32b corresponding to the portion necessary for flattening the surface of the insulating layer 33, such as the portion for face-down mounting of an IC chip 61 is formed by a relatively low line (a thin conductor film). As the height of the conductor 32b drops, the conductor resistance increases, but by increasing the line width of the conductor 32b as required, adverse effects on electrical characteristics can be suppressed. Thus, according to the invention, considering the trade-off of the request for surface shape of the insulating layer 33 and the request for electrical characteristic of the conductor pattern, an optimum shape of conductor pattern can be obtained.

As clear from the description herein, according to the manufacturing method of the electronic components of the invention, the intaglio is manufactured by forming the groove pattern corresponding to the conductor pattern to be formed on the surface of the resin sheet rich in flexibility by irradiation with excimer laser. The conductive paste to be applied in the groove pattern of the intaglio is completely transferred substantially on the substrate as the forming object. Besides, since the shape of the groove to be formed in the intaglio may be made sharp, the shape of the conductor pattern formed by firing after transfer may be also a desired actuate rectangular shape. As a result, the electric characteristic of the formed conductor pattern is improved.

In the aspect of the size, it is possible to form fine and thick conductor pattern with the line width of conductor pattern of 10 µm or less and the thickness of conductor film of 5 µm or more. It is also possible to increase the thickness of the conductor film only in desired positions, that is, the line of the conductor pattern can be heightened. By applying these points, according to the manufacturing method of the electronic components of the invention, it is possible to form fine via-holes with the width being substantially same as the size of the fine conductor pattern. Therefore, the electronic components having small and laminate structure difficult to realize by the conventional printing method can be manufactured at low cost.

In the description of the first and second embodiments, the invention is explained by referring to examples of electronic components in which it is required to form a thick portion of conductor film in the conductor pattern, but the invention is not limited to these embodiments alone. For example, in other electronic components, that is, in electronic components not required to be partially different or greater in the thickness of the conductor film, evidently, the manufacturing method of electronic components of the invention can be applied. Even in such case, peeling is easy and secure in the transfer step by the using of the intaglio formed from a flexible resin sheet, and the pattern of shape rectangular form can be formed by pattern forming on the intaglio by excimer laser, which are sufficiently effective improving means for the characteristics of the electronic components to be manufactured. Therefore, modified examples existing within the true spirit and scope of the invention should be all included in the scope of the claims thereof.

What is claimed is:

1. A method of manufacturing an electronic component including a conductor pattern on a substrate, comprising the steps of:
    fabricating an intaglio by forming a groove pattern corresponding to a conductor pattern on a surface of a flexible resin;
    forming a peeling layer on the surface of the intaglio for the ease of peeling of the substrate and intaglio;
    filling a groove of the groove pattern with conductive paste;
    drying the applied conductive paste;
    repeating a step of refilling with additional conductive paste for compensating for the volume decrease of the conductive paste decreased by the drying step, and a step of re-drying the conductive paste after refilling, by a specific number of times;
    adhering together the intaglio and substrate, by overlaying the intaglio and the substrate through either one of water and water-soluble resin, and freezing either one of water and water-soluble resin by applying temperature in a predetermined range and pressure in a predetermined range;
    transferring a pattern of the conductive paste on the substrate by peeling the intaglio from the substrate in frozen state; and
    forming a conductor pattern by firing the transferred pattern of the conductive paste.

2. A method of manufacturing an electronic component of claim 1, wherein part of the groove is formed deeper than other parts so as to vary the height of the conductor pattern partly.

3. A method of manufacturing an electronic component of claim 1, wherein the groove has a sectional shape with a taper angle at the side.

4. A method of manufacturing an electronic component of claim 1, wherein laser having an oscillation frequency in ultraviolet region is used when forming the groove.

5. A method of manufacturing an electronic component of claim 4, wherein the laser is excimer laser.

6. A method of manufacturing an electronic component of claim 1, wherein the peeling layer is composed of a monomolecular film of fluorocarbon compound.

7. A method of manufacturing an electronic component of claim 1, wherein the conductive paste contains a plasticizer.

8. A method of manufacturing an electronic component of claim 1, wherein the water-soluble resin is composed of one selected from the group consisting of PVA, polyvinyl acetal, cellulose ether, methyl vinyl ether and maleic acid anhydride copolymer, gelatin, and galactose.

9. A method of manufacturing an electronic component of claim 1, wherein the substrate is an insulating substrate composed of any one of dielectric material, magnetic material, and insulating material.

10. A method of manufacturing an electronic component of claim 1, wherein the substrate is formed of a green sheet.

11. A method of manufacturing an electronic component including a conductor pattern on a substrate, comprising the steps of:
    fabricating an intaglio by forming a groove pattern corresponding to a conductor pattern on a surface of a flexible resin;
    forming a peeling layer on the surface of the intaglio for the ease of peeling of the substrate and intaglio;
    filling a groove of the groove pattern with conductive paste;
    drying the applied conductive paste;
    repeating a step of refilling with additional conductive paste for compensating for the volume decrease of the conductive paste decreased by the drying step, and a step of re-drying the conductive paste after refilling, by a specific number of times;
    adhering together the intaglio and substrate, by overlaying the intaglio and the substrate through either one of water and water-soluble resin, and freezing either one of water and water-soluble resin by applying temperature in a predetermined range and pressure in a predetermined range;
    transferring a pattern of the conductive paste on the substrate by peeling the intaglio from the substrate in frozen state;
    forming a first conductor pattern by firing the transferred pattern of the conductive paste;
    forming an insulating layer for covering at least part of the first conductor pattern;
    forming a second conductor pattern on a surface of the insulating layer; and
    forming an electrode in an exposed portion of the first conductor pattern from the insulating layer, for electrically connecting the first conductor pattern and second conductor pattern.

12. A method of manufacturing an electronic component of claim 11, wherein a portion formed in a greater height of the first conductor pattern is used as the electrode.

13. A method of manufacturing an electronic component of claim 12, wherein a portion of the first conductor pattern corresponding to a portion for forming a flat part on the surface of the insulating layer is formed in a lower height.

14. A method of manufacturing an electronic component of claim 13, further comprising a step of mounting an IC chip with face down in the flat part of the surface of the insulating layer.

15. A method of manufacturing an electronic component of claim 11, wherein the insulating layer is composed of one of magnetic material and dielectric material.

16. A method of manufacturing an electronic component of claim 11, wherein part of the groove is formed deeper than other parts so as to vary the height of the first conductor pattern partly.

17. A method of manufacturing an electronic component of claim 11, wherein the groove has a sectional shape with a taper angle at the side.

18. A method of manufacturing an electronic component of claim 11, wherein laser having an oscillation frequency in ultraviolet region is used when forming the groove.

19. A method of manufacturing an electronic component of claim 18, wherein the laser is excimer laser.

20. A method of manufacturing an electronic component of claim 11, wherein the peeling layer is composed of a monomolecular film of fluorocarbon compound.

21. A method of manufacturing an electronic component of claim 11, wherein the conductive paste contains a plasticizer.

22. A method of manufacturing an electronic component of claim 11, wherein the water-soluble resin is composed of one selected from the group consisting of PVA, polyvinyl acetal, cellulose ether, methyl vinyl ether and maleic acid anhydride copolymer, gelatin, and galactose.

23. A method of manufacturing an electronic component of claim 11, wherein the substrate is an insulating substrate composed of any one of dielectric material, magnetic material, and insulating material.

24. A method of manufacturing an electronic component of claim 11, wherein the substrate is formed of a green sheet.

* * * * *

UNITED STATES PATENT AND TRADEMARK OFFICE
CERTIFICATE OF CORRECTION

PATENT NO.   : 6,051,448
DATED        : April 18, 2000
INVENTOR(S)  : Masaaki Hayama et al.

It is certified that error appears in the above-identified patent and that said Letters Patent is hereby corrected as shown below:

Columns 15-18,
Beginning at line 35, claims 1-24 should be deleted and substitute the attached claims 1-26:
1. A method of manufacturing an electronic component including a conductor pattern on a substrate, comprising the steps of:
    fabricating an intaglio by forming a groove pattern corresponding to a conductor pattern on a surface of a flexible resin:
    filling a groove of the groove pattern with conductive paste;
    drying the applied conductive paste;
    adhering together the intaglio and substrate, by overlaying the intaglio and the substrate through either one of water and water-soluble resin, and freezing either one of water and water-soluble resin by applying temperature in a predetermined range and pressure in a predetermined range;
    transferring a pattern of the conductive paste on the substrate by peeling the intaglio from the substrate in frozen state; and
    forming a conductor pattern by firing the transferred pattern of the conductive paste.
2. A method of manufacturing an electronic component of claim 1, further comprising the steps of:
    forming a peeling layer on the surface of the intaglio for the ease of peeling of the substrate and intaglio; and
    repeating a step of refilling with additional conductive paste for compensating for the volume decrease of the conductive paste decreased by the drying step, and a step of re-drying the conductive paste after refilling, by a specific number of times.
3. A method of manufacturing an electronic component of claim 1, wherein part of the groove is formed deeper than other parts so as to vary the height of the conductor pattern partly.
4. A method of manufacturing an electronic component of claim 1, wherein the groove has a sectional shape with a taper angle at the side.
5. A method of manufacturing an electronic component of claim 1, wherein laser having an oscillation frequency in ultraviolet region is used when forming the groove.
6. A method of manufacturing an electronic component of claim 5, wherein the laser is excimer laser.

UNITED STATES PATENT AND TRADEMARK OFFICE
CERTIFICATE OF CORRECTION

| | | |
|---|---|---|
| PATENT NO. | : 6,051,448 | |
| DATED | : April 18, 2000 | |
| INVENTOR(S) | : Masaaki Hayama et al. | |

It is certified that error appears in the above-identified patent and that said Letters Patent is hereby corrected as shown below:

7. A method of manufacturing an electronic component of claim 1, wherein the peeling layer is composed of a monomolecular film of fluorocarbon compound.

8. A method of manufacturing an electronic component of claim 1, wherein the conductive paste contains a plasticizer.

9. A method of manufacturing an electronic component of claim 1, wherein the water-soluble resin is composed of one selected from the group consisting of PVA, polyvinyl acetal, cellulose ether, methyl vinyl ether and maleic acid anhydride copolymer, gelatin, and galactose.

10. A method of manufacturing an electronic component of claim 1, wherein the substrate is an insulating substrate composed of any one of dielectric material, magnetic material, and insulating material.

11. A method of manufacturing an electronic component of claim 1, wherein the substrate is formed of a green sheet.

12. A method of manufacturing an electronic component including a conductor pattern on a substrate, comprising the steps of:
    fabricating an intaglio by forming a groove pattern corresponding to a conductor pattern on a surface of a flexible resin:
    filling a groove of the groove pattern with conductive paste;
    drying the applied conductive paste;
    adhering together the intaglio and substrate, by overlaying the intaglio and the substrate through either one of water and water-soluble resin, and freezing either one of water and water-soluble resin by applying temperature in a predetermined range and pressure in a predetermined range;
    transferring a pattern of the conductive paste on the substrate by peeling the intaglio from the substrate in frozen state;
    forming a first conductor pattern by firing the transferred pattern of the conductive paste;
    forming an insulating layer for covering at least part of the first conductor pattern;
    forming a second conductor pattern on a surface of the insulating layer; and
    forming an electrode in an exposed portion of the first conductor pattern from the insulating layer, for electrically connecting the first conductor pattern and second conductor pattern.

UNITED STATES PATENT AND TRADEMARK OFFICE
CERTIFICATE OF CORRECTION

PATENT NO. : 6,051,448
DATED : April 18, 2000
INVENTOR(S) : Masaaki Hayama et al.

It is certified that error appears in the above-identified patent and that said Letters Patent is hereby corrected as shown below:

13. A method of manufacturing an electronic component of claim 12, further comprising the steps of:
 forming a peeling layer on the surface of the intaglio for the ease of peeling of the substrate and intaglio; and
 repeating a step of refilling with additional conductive paste for compensating for the volume decrease of the conductive paste decreased by the drying step, and a step of re-drying the conductive paste after refilling, by a specific number of times.
14. A method of manufacturing an electronic component of claim 12, wherein a portion formed in a greater height of the first conductor pattern is used as the electrode.
15. A method of manufacturing an electronic component of claim 14, wherein a portion of the first conductor pattern corresponding to a portion for forming a flat part on the surface of the insulating layer is formed in a lower height.
16. A method of manufacturing an electronic component of claim 15, further comprising a step of mounting an IC chip with face down in the flat part of the surface of the insulating layer.
17. A method of manufacturing an electronic component of claim 12, wherein the insulating layer is composed of one of magnetic material and dielectric material.
18. A method of manufacturing an electronic component of claim 12, wherein part of the groove is formed deeper than other parts so as to vary the height of the first conductor pattern partly.
19. A method of manufacturing an electronic component of claim 12, wherein the groove has a sectional shape with a taper angle at the side.
20. A method of manufacturing an electronic component of claim 12, wherein laser having an oscillation frequency in ultraviolet region is used when forming the groove.
21. A method of manufacturing an electronic component of claim 20, wherein the laser is excimer laser.
22. A method of manufacturing an electronic component of claim 12, wherein the peeling layer is composed of a monomolecular film of fluorocarbon compound.

UNITED STATES PATENT AND TRADEMARK OFFICE
CERTIFICATE OF CORRECTION

PATENT NO.    : 6,051,448
DATED         : April 18, 2000
INVENTOR(S)   : Masaaki Hayama et al.

It is certified that error appears in the above-identified patent and that said Letters Patent is hereby corrected as shown below:

23.   A method of manufacturing an electronic component of claim 12, wherein the conductive paste contains a plasticizer.
24.   A method of manufacturing an electronic component of claim 12, wherein the water-soluble resin is composed of one selected from the group consisting of PVA, polyvinyl acetal, cellulose ether, methyl vinyl ether and maleic acid anhydride copolymer, gelatin, and galactose.
25.   A method of manufacturing an electronic component of claim 12, wherein the substrate is an insulating substrate composed of any one of dielectric material, magnetic material, and insulating material.
26.   A method of manufacturing an electronic component of claim 12, wherein the substrate is formed of a green sheet.

Signed and Sealed this

Sixth Day of August, 2002

*Attest:*

JAMES E. ROGAN
*Attesting Officer*     *Director of the United States Patent and Trademark Office*

UNITED STATES PATENT AND TRADEMARK OFFICE
CERTIFICATE OF CORRECTION

PATENT NO. : 6,051,448
DATED : April 18, 2000
INVENTOR(S) : Hayama, Masaaki

It is certified that error appears in the above-identified patent and that said Letters Patent is hereby corrected as shown below:

The title page, showing illustrative figure, should be deleted and therefore the attached title page.

Delete columns 1-18, and therefore attahced columns 1-18.

Signed and Sealed this

Fourth Day of January, 2005

JON W. DUDAS
*Director of the United States Patent and Trademark Office*

United States Patent [19]
Hayama et al.

[11] Patent No.: 6,051,448
[45] Date of Patent: *Apr. 18, 2000

[54] METHOD OF MANUFACTURING AN ELECTRONIC COMPONENT

[75] Inventors: Masaaki Hayama, Nara; Noboru Mouri, Katano; Tetsu Murakawa, Neyagawa; Hayami Matsunaga, Hirakata; Masayuki Mizuno, Toyono-gun, all of Japan

[73] Assignee: Matsushita Electric Industrial Co., Ltd., Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/870,344

[22] Filed: Jun. 6, 1997

[30] Foreign Application Priority Data

Jun. 11, 1996  [JP] Japan .................................. 8-148814

[51] Int. Cl.[7] .................. H01L 21/283; H01L 21/56; H01L 21/58; H01L 21/60
[52] U.S. Cl. .................. 438/108; 438/611; 438/616; 438/622; 438/623; 438/662; 438/670; 438/977
[58] Field of Search .................. 438/611, 616, 438/622, 623, 108, 662, 670, 977, FOR 342, FOR 343, FOR 348, FOR 363, FOR 375, FOR 395, FOR 455, FOR 485, FOR 489

[56] References Cited

U.S. PATENT DOCUMENTS

| | | |
|---|---|---|
| 3,621,564 | 11/1971 | Tanaka et al. . |
| 3,719,981 | 3/1973 | Steitz . |
| 4,857,482 | 8/1989 | Saito et al. . |
| 5,106,461 | 4/1992 | Volfson et al. . |
| 5,546,375 | 8/1996 | Shimada et al. . |
| 5,643,831 | 7/1997 | Ochiai et al. . |

FOREIGN PATENT DOCUMENTS

| | | |
|---|---|---|
| 2-30140 | 1/1990 | Japan . |
| 4-221674 | 8/1992 | Japan . |
| JP4-240792 | 8/1992 | Japan . |
| JP6-5608 | 1/1994 | Japan . |
| JP6-124953 | 5/1994 | Japan . |
| 6-267963 | 9/1994 | Japan . |

*Primary Examiner*—David E. Graybill
(74) *Attorney, Agent, or Firm*—Ratner & Prestia

[57] ABSTRACT

In a method of manufacturing an electronic component for forming a conductor pattern on an insulating substrate by transfer method employing intaglio printing technique, this manufacturing method comprises a step of fabricating an intaglio 20 made of flexible resin forming an insulating layer 23 on a groove 21, a step of filling the groove 21 with Ag paste 24 and drying, a step of overlaying the intaglio 20 on an insulating substrate 2 having a water-soluble resin 28 formed on the surface by pressing a pressing portion 26, freezing, peeling off the intaglio 20 and insulating substrate 2, and transferring the pattern of the Ag paste 24, and a step of firing it and forming a conductor pattern.

26 Claims, 9 Drawing Sheets

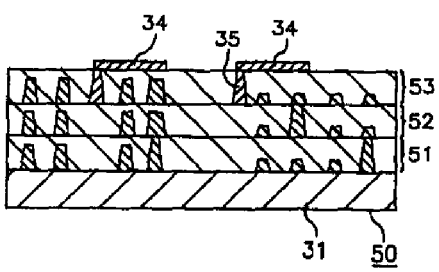

METHOD OF MANUFACTURING AN ELECTRONIC COMPONENT

BACKGROUND OF THE INVENTION

The present invention relates to a method of manufacturing an electronic component to be used in various electronic appliances, and more particularly to a method of manufacturing an electronic component manufactured by intaglio printing.

Recently, electronic appliances are reduced in size, and hence electronic components used in such electronic appliances are also promoted in downsizing. In such background, the conductor patterns of electronic components are requested to be finer in the conductor lines (hereinafter lines for short) for composing patterns, greater in the film thickness of conductor film for composing the conductor patterns for lowering the line resistance, and laminated in structure for reducing the size.

Conductor patterns of conventional electronic components were formed by printing patterns of conductive paste such as silver paste and copper paste on a substrate as a forming object by printing method such as screen printing and intaglio printing, and firing it. For example, as an application of intaglio printing method, in a printing method as disclosed in Japanese Laid-open Patent Publication No. 4-240792, the intaglio corresponding to the conductor pattern to be formed is filled with conductive paste (organic metal ink), the conductive paste is dried and cured, and the pattern is transferred onto the forming object of substrate through a setting resin, so that the desired conductor pattern is formed.

Moreover, in the hybrid IC, thermal head or transparent electrode, since the width of each line and line interval in the conductor pattern are very small, the method making use of thin film forming and etching is often employed. In this method, first, a thin film of conductive material such as gold, aluminum, and ITO (indium tin oxide) is formed on the substrate by vapor deposition or sputtering, and successively a mask pattern corresponding to a desired conductor pattern is formed by photolithography using a photosensitive resin. Consequently, etching the thin film of conductor material by using etchant and mask pattern, the photosensitive resin is finally removed, and the conductor pattern is formed.

In such conventional manufacturing method, however, the following problems are involved.

First, the conventional screen printing method is relatively inexpensive in equipment and is small in the number of requiring manufacturing steps. It is, however, difficult to form fine conductor patterns, and it is extremely difficult to define the line width at less than 70 μm or reduce the line pitch below 150 μm. In screen printing, moreover, since the conductor pattern is printed uniformly, height difference (line height difference) cannot be formed in the pattern depending on the design requirements.

Next, the conventional intaglio printing can form fine conductor patterns with the line width of about 50 μm and line pitch of about 100 μm, but it is hard to form a conductor film having thickness of 5 μm or more. It is therefore limited to reduce the electric resistance of the conductor.

Incidentally, to achieve a desired high density of electronic components, it may not be enough by reducing the size of conductor pattern of each layer, and it may be required to form in a laminate structure. Such laminate structure has multiple layers of sandwich structure composed of lower layer conductor pattern, insulating layer, and upper layer conductor pattern. In this case, it is necessary to form via holes for connecting the conductor patterns of upper layer and lower layer, and as the size of the conductor pattern is reduced, via holes must be also reduced in size. However, in the conventional printing methods including the printing method disclosed in the above Publication No. 4-240792, it is extremely difficult to form very fine via holes with diameter of less than 100 μm. Moreover, in order to achieve reliable electric connection between the conductor patterns of upper layer and lower layer, it is needed to form an electrode (called via hole electrode) for connecting the upper layer and lower layer in the inside of the via hole. In the conventional methods, however, if fine via holes of less than 100 μm in diameter be formed, it is extremely difficult to form an electrode inside of the via hole of such small size.

In the conventional intaglio printing, generally, the intaglio made of stiff material such as glass and silicon wafer is used. In this case, in the step of transferring the conductor pattern on the forming object, such as ceramic or glass substrate through a setting resin, if attempted to peel off the adhered intaglio and forming object, the intaglio is hardly deformed. Accordingly, the intaglio and forming object adhering on both sides must be peeled off, and a strong peeling force is needed. To solve this problem, a metal sheet may be used for the intaglio so that the intaglio may be flexible. Even in such a case, the pattern shape processing of intaglio (groove forming) is done by wet etching, but this etching is isotropic etching. It is hence impossible to process the intaglio of high aspect ratio necessary for forming conductor pattern of thick conductor film (that is, tall line height) for the line width.

Besides, when forming the conductor pattern by firing the pattern formed of conductive paste material on the forming object such as ceramic or glass substrate through a setting resin, the thickness of the setting resin is required to be 4 μm or more. At this time, the setting resin generates combustion gas while the temperature is being raised in the firing process, and the pattern deformation occurs. As a result, in the conventional intaglio printing, the dimensional accuracy is not achieved.

On the other hand, the conductor pattern forming method making use of photolithography is effective for forming patterns of small area in a line width of several microns or less as in the semiconductor technology. However, in the formation of conductor pattern used in electronic components such as inductors, it is generally required to form a pattern of a relatively wide area. In such a case, a series of steps including vapor deposition of conductive film, application of resist, exposure, development, etching, and resist removal must be done by using large-sized equipment. As a result, the equipment becomes expensive, and the manufacturing cost increases.

SUMMARY OF THE INVENTION

The invention is devised to solve the above problems, and it is a first object thereof to present a method of manufacturing an electronic component capable of forming a fine conductor pattern containing a via hole electrode of nearly same size as the line width, with the line width of conductor pattern being 10 μm or less and thickness of conductive film being 5 μm or more, precisely, at low cost and at high reliability. It is a second object thereof to present a method of manufacturing an electronic component capable of varying the thickness of a conductor film at an arbitrary position of conductor pattern from other position so as to have a height difference in the conductor pattern, depending on the design requirement of conductor pattern. It is a third object thereof to present a method of manufacturing an electronic component capable of laminating conductor patterns having such features.

To achieve the objects, a method of manufacturing an electronic component of the invention comprises a step of manufacturing an intaglio by forming a groove pattern corresponding to a conductor pattern on the surface of a flexible resin, a step of forming a peeling layer for the ease of peeling of substrate and intaglio on the surface of the intaglio, a step of filling the groove with conductive paste, a step of drying the conductive paste, a step of refilling with additional conductive paste to compensate for the loss of volume by drying of the conductive paste decreased in the drying step, a step of repeating the step of re-drying the conductive paste after refilling for a specified number of times, a step of gluing the intaglio and substrate by overlaying the intaglio and substrate through either one of water and water-soluble resin, and freezing either one of water and water-soluble resin by applying temperature in a specific range and pressure in a specific range, a step of peeling the intaglio off the substrate in frozen state and transferring the pattern of the conductive paste on the substrate, and a step of firing the transferred pattern of conductive paste to form a conductor pattern. According to this manufacturing method, an electronic component having a fine conductor pattern including a via hole electrode of nearly same size as the line width, with the line width of 10 μm or less and line thickness of 5 μm or more can be manufactured.

Moreover, by forming a part of the groove formed in the intaglio deeper than in other parts, an electronic component differing in the thickness of the conductor pattern at a specified position can be manufactured.

Still more, in the manufacturing method further comprising a step of forming an insulating layer for covering a part of the conductor pattern formed by the above method (hereinafter called first conductor pattern), a step of forming a second conductor pattern on the surface of this insulating layer, and a step of forming an electrode for electrically connecting the first conductor pattern and second conductor pattern, in the portion not covered with the insulating layer of the first conductor pattern, an electronic component having a laminate structure may be obtained easily.

BRIEF DESCRIPTION OF THE DRAWINGS

FIG. 1(a) is a schematic plan view of a chip inductor in a first embodiment of the invention, and FIG. 1(b) is a sectional view along line 1B—1B in FIG. 1(a).

Figure 7A:
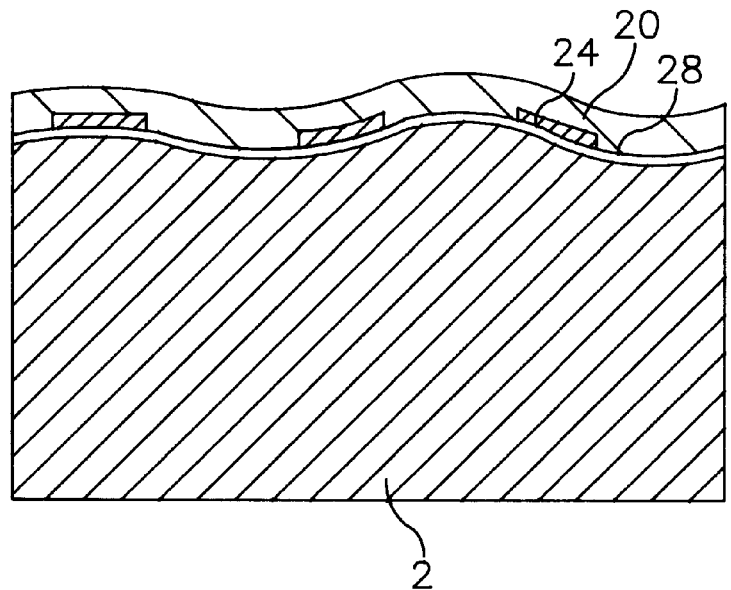
FIG. 7(a) is a schematic sectional view of laminate state of polyimide intaglio and insulating substrate.
Figure 7B:
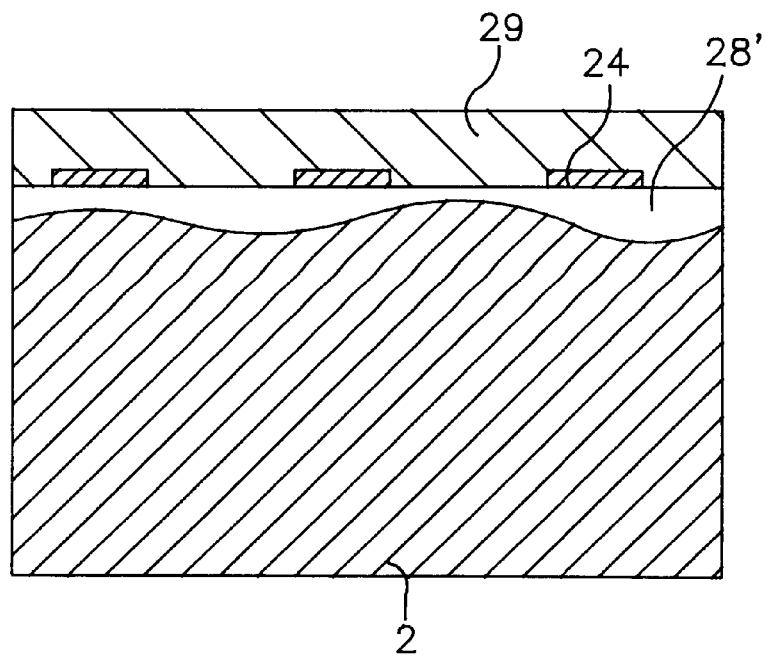
FIG. 7(b) is a schematic sectional view of laminate state of conventional glass intaglio and insulating substrate.
Figure 8:
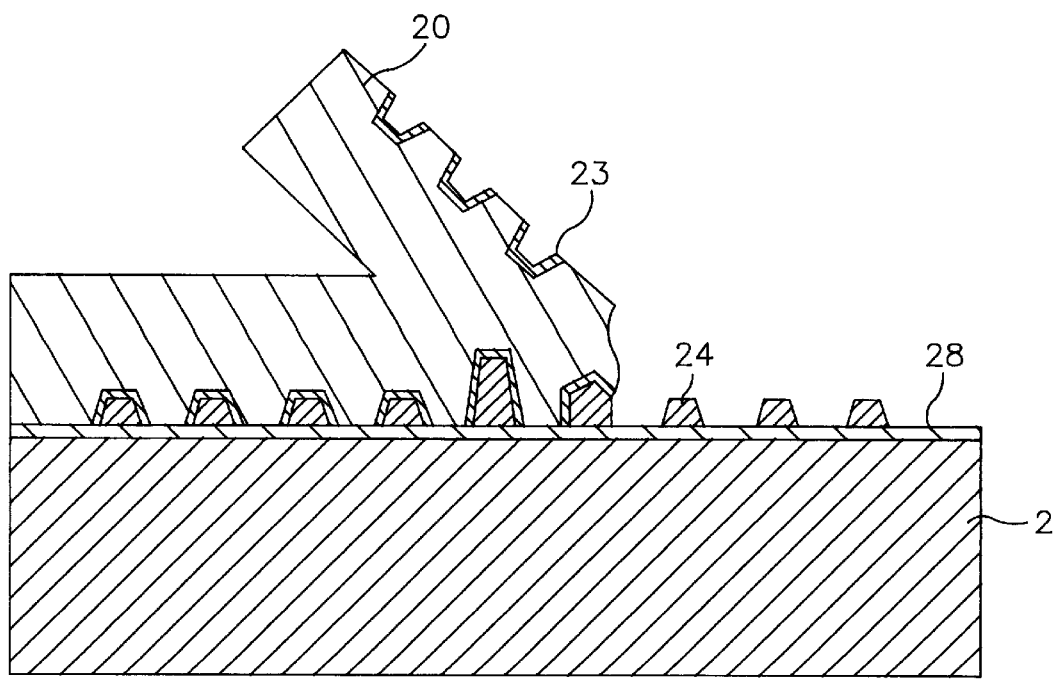
FIG. 8 is a schematic outline diagram of peeling process.
Figure 9:
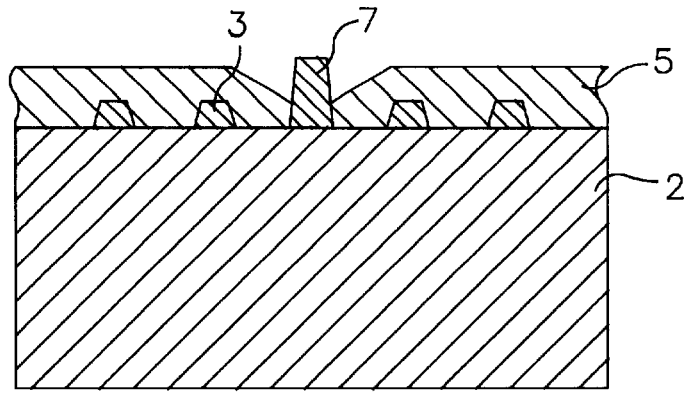
FIG. 9 is a schematic sectional view of shape of via hole.

FIG. 2 is a block diagram showing a flow of manufacturing process of electronic component of the invention, FIG. 3 is a schematic outline diagram showing manufacturing process of intaglio in its manufacturing process, FIG. 4 is a schematic sectional view of groove on the intaglio surface, FIG. 5 is a schematic outline diagram of filling process of conductor paste in the intaglio, FIG. 6 is a schematic outline diagram of laminate process, FIG. 7(a) is a schematic sectional view of laminate state of polyimide intaglio and insulating substrate, FIG. 7(b) is a schematic sectional view of laminate state of conventional glass intaglio and insulating substrate, FIG. 8 is a schematic outline diagram of peeling process, and FIG. 9 is a schematic sectional view of shape of via hole.

FIG. 10(a) is a schematic plan view of a hybrid IC substrate in a second embodiment of the invention, and FIG. 10(b) is a sectional view along line 11B—11B in FIG. 10(a).

Figure 12:
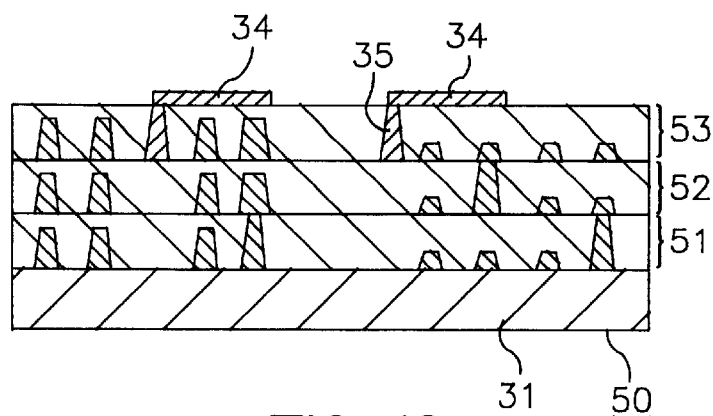
FIG. 12 is a schematic sectional view of another hybrid IC substrate.
Figure 13:
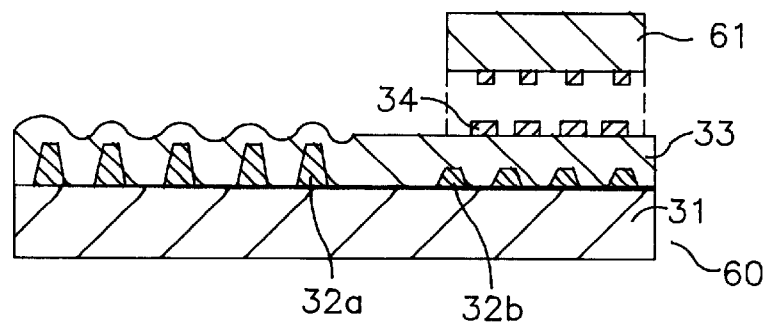
FIG. 13 is a schematic sectional view of a further different hybrid IC substrate.

FIG. 11 is a schematic sectional view of other hybrid IC substrate manufacturing a manufacturing method of the invention, FIG. 12 is a schematic sectional view of another hybrid IC substrate, and FIG. 13 is a schematic sectional view of a further different hybrid IC substrate.

PREFERRED EMBODIMENTS OF THE INVENTION

A first embodiment of a method of manufacturing an electronic component of the invention is described below by reference to FIG. 1 through FIG. 9, relating to an example of manufacturing method of chip inductor for high frequency. In the following drawings, same constituent elements are identified with same reference numerals.

A chip inductor 1 has a spiral coil conductor (line) 3 formed on the surface near the center of an insulating substrate 2 of 2.0 mm×1.25 mm, and terminal electrodes 4a and 4b formed at both edges of the insulating substrate 2. An outer end 3a of the coil conductor 3 is connected to one terminal electrode 4a. An inner end 3b of the coil conductor 3 is connected to other terminal electrode 4b through a lead electrode 6 and a via hole electrode 7. The lead electrode 6 is formed on the surface of an insulating layer 5 formed on the insulating substrate 2 so as to cover the coil conductor 3. The via hole electrode 7 connects the lead electrode 6 existing on the surface of the insulating layer 5 and the coil conductor 3 existing beneath the insulating layer 5.

The chip inductor 1 is manufactured in the intaglio printing method as explained below. Steps 210 to 310 explained below are shown in a block diagram in FIG. 2.

Referring first to FIG. 3, a manufacturing step 210 of intaglio 20 to be used is described. The intaglio 20 is formed on a polyimide film 15 of 125 μm in thickness formed on an XY stage 16. A laser beam of wavelength of 248 nm in an ultraviolet ray region emitted from an excimer laser device 11 illuminates a mask 12 having a mask pattern corresponding to the spiral pattern of the coil to be formed and the pattern of terminal electrode. The laser beam after passing through the mask 12 is reflected by a mirror 13, reduced by an imaging lens 14, and emitted on the polyimide film 15. The portion of the polyimide film 15 illuminated with the laser beam is decomposed by photochemical reaction, and a groove 21 (see FIG. 4) corresponding to the line of the conductor pattern is formed. As a result, the intaglio 20 corresponding to the desired pattern is formed. By repeating the same illumination operation by moving the XY stage 16, typically, a total of 4000 intaglios 20 in the size of 2.0×1.25 mm are formed on the polyimide film 15 of 100 mm×100 mm.

Whereas the processing by carbon dioxide laser and YAG laser is processing by pyrolysis by the laser beam in the infrared wavelength region, processing by excimer laser is processing by photolysis by the laser beam in the ultraviolet wavelength region in which the peak power reaches up to scores of megawatts. Since processing by excimer laser is short in the pulse width of laser beam, thermal effects on the surroundings except for the processing region are small. Accordingly, the processing by excimer laser is preferred because fine processing with the pattern line width of 10 μm or less is realized.

Moreover, the surface of the polyimide film 15 illuminated with the laser beam is in a very chemically activated sate as the bonding of molecules for composing the film is cut off. Therefore, chemical bonding is likely to occur in this portion. This feature is advantageous for forming the peeling layer described later.

FIG. 4 shows a typical sectional shape of the groove 21 of the intaglio 20 formed in the above method. By properly adjusting the characteristics of the optical system used in the laser processing process, such as the focal depth of the lens, preferably, the groove 21 should be formed in a trapezoidal sectional shape having a taper angle of 2 to 60° on the side. Accordingly, in a later process, it is easy to transfer the conductive paste charged inside the groove 21 onto the forming object. The shape of the laser beam to be used is, typically, a rectangular form of 8 mm×24 mm at the exit point from the excimer laser device 11, and is a rectangular form of 3.2mm×9.6 mm at the point of emission to the polyimide film 15.

It is preferred to form a proper protective film on the processing surface of the polyimide film 15 as the material for the intaglio 20. As a result, the processing surface of the intaglio 20 can be protected from the interaction with the plasma generated when forming the groove 21, and deformation of the opening of the groove 21 of the surface of the intaglio 20 can be prevented. As the material of the protective layer for this purpose, for example, it is preferred to use polyethylene terephthalate (PET), polycarbonate (PC), or polysulfone (PSF).

Consequently, replacing the mask 12 with a mask for forming the via hole electrode 7, the laser beam is further emitted, and a circular pit 22 (see FIG. 5) corresponding to the via hole electrode 7 is formed at a specified position of the groove 21 of the conductor pattern formed in the preceding process. When forming the pit 22, fine processing is possible same as when forming the groove 21, and it is preferred that the pit 22 should have a taper shape for the ease of transfer of the charged conductive paste. Meanwhile, it is also possible to form the pit 22 having other shape than the cylindrical shape.

In this method is formed the intaglio 20 comprising the groove 21 of 20 μm in depth corresponding to the line of the conductor pattern of 10 to 50 μm in width, and the pit 22 of 60 μm in diameter corresponding to the via hole electrode of 45 μm in diameter. The depth of the groove 21 and pit 22 can be freely changed in the units of 0.2 μm without having to change the width of the line (width of the groove 21) by varying only the irradiation time of the laser beam, so that an optimum value may be obtained. Incidentally, the width of the groove 21 and the diameter of the pit 22 may be easily adjusted by changing the dimensions of the mask. According to the method of the invention, the line width of the conductor pattern can be defined to be less than 10 μm, or the size of the via hole may be reduced to correspond to such fine line.

As the material for the intaglio 20, it is preferred to use polyimide film 15. As a result, the intaglio 20 may have flexibility. The effects obtained as a result are described below.

Using the intaglio 20 formed in this method, a conductor pattern is formed on the substrate or the forming object. However, the polyimide film 15 used as the material for the intaglio 20 is not sufficient in peeling from the conductive paste charged and transferred in the groove 21 and pit 22. Accordingly, in the transfer process, the conductive paste is likely to be left, over in the groove 21 and pit 22. In particular, in the pit 22 corresponding to the via hole electrode 7, since the depth is great, remainder of conductive paste occurs very notably. As a result, the shape of the intaglio 20 may not be transferred sufficiently. Therefore, to realize transfer of substantially perfect intaglio shape, a forming step 220 of peeling layer on the surface of the intaglio 20, in particular, the surface of the groove 21 and pit 22 is necessary.

To solve this problem, the present inventors intensively studied the peeling process of the polyimide film 15 from the viewpoint of peeling strength from the conductive paste and the life of the processing layer, in particular. As a result, it was found particularly effective to form the peeling layer of fluorocarbon monomolecular film in the following method.

First, oxygen plasma is emitted to the surface of the intaglio 20 by plasma ashing apparatus, and the density of the oxygen remaining on the surface of the intaglio 20 is increased. On the other hand, in a mixed solution of 80% of n-hexadecane (or toluene, xylene or dichlorohexyl), 10% of carbon tetrachloride, and 8% of chloroform, a nonaqueous solvent mixing a substance containing fluorocarbon group and chlorosilane group, for example, $CF_3(CF_2)_7(CH_2)_2SiCl_3$, is dissolved at a concentration of about 1%, and a solution is prepared. In this solution, the intaglio 20 thus treated in oxygen is immersed, and an oxide film is formed on the surface of the intaglio 20. Multiple hydroxyl groups are contained on the surface of this oxide film, and they react with SiCl group of the substance containing fluorocarbon group and chlorosilane group, and dechlorination reaction takes place. As a result, fluorocarbon monomolecular film chemically adsorbed by covalent bond on the surface of the intaglio 20 is formed on the entire surface of the intaglio 20. This monomolecular film functions effectively as the peeling layer 23 (see FIG. 5).

The position requiring a large peeling force when peeling is mainly the portion of the groove 21 and pit 22, and the peeling layer 23 is preferred to be formed mainly in such area. On the other hand, as mentioned above, of the polyimide film 15 for composing the intaglio 20, the portion forming the groove 21 and pit 22 by excimer laser processing is in a chemically active state. As a result, the peeling layer 23 of the fluorocarbon monomolecular film is bonded and formed more inside of the groove 21 and pit 22 requiring a large peeling force when peeling. The bonding between the peeling layer 23 and intaglio 20, that is, the monomolecular film and the polyimide film 15 is covalent bond, and the both are bonded very strongly, and the durability of the peeling effect is excellent. Moreover, the thickness of the peeling layer 23 is as thin as 100 to 1000 angstroms, so that the inside of the intaglio 20 may be filled with much conductive paste without having effects on the shape precision of the intaglio 20. Thus, the peeling layer 23 formed on the surface of the intaglio 20 at step 220 has excellent properties in many aspects.

At step 230, consequently, Ag paste 24 is applied as conductive paste on the surface of the intaglio 20 in which the peeling layer 23 is formed. Then, as shown in FIG. 5, by scratching the surface of the intaglio 20 after application by a squeegee 25, extra Ag paste 24 on the surface of the intaglio 20 can be removed, and the inside of the groove 21 and pit 22 is filled with Ag paste 24 sufficiently. The material of the squeegee 25 used herein is preferred to be ceramic owing to the following reason. That is, in the case of resin or steel made squeegee, the squeegee surface is likely to be flawed by the foreign matter contained in the Ag paste 24 or dust present on the surface of the intaglio 20. As a result, the surface of the intaglio 20 may be damaged by the flaw on the squeegee surface, and the life of the intaglio 20 may be shortened. In the case of ceramic made squeegee 25, by contrast, since it is rigid, its end is hardly damaged by foreign matter or dust. Moreover, when the end of the ceramic squeegee 25 is polished by a fine abrasive of roughness of 2000 or more, wear due to long-term abrasion may be avoided. As a result, the ceramic squeegee hardly damages the surface of the intaglio 20.

Next, the intaglio 20 filled with Ag paste 24 is dried by using a circulation type hot air dryer, and the organic solvent in the Ag paste 24 is evaporated (step 240). Thus, the Ag paste 24 filling the groove 21 and pit 22 in the intaglio 20 is fitted to the shape of the groove 21 and pit 22, so that a sharper shape may be formed. The drying means is not limited to the one shown above only.

On the surface of the intaglio 20 used in the embodiment, relatively deep groove 21 and pit 22 are formed, and in particular the maximum depth of the pit 22 is as much as 60 µm. Accordingly, in this drying step 240, if the intaglio 20 is dried quickly at temperature over 100° C., pin holes of 5 to 40 µm in diameter are likely to be formed in the Ag paste 24 charged in the groove 21 and pit 22. In the fine conductor pattern with the line width of 50 µm or less, such pin holes may cause open failure after pattern firing, thereby impeding forming of favorable conductor pattern. Hence, in the drying step 240, it is preferred to dry the intaglio 20 in step stages as shown below. First, at temperature of 100° C. or less, preliminary drying is continued for 5 minutes, and at 150° C., drying is done for 5 minutes. In this two-stage drying, forming of pin holes may be prevented, and a conductor pattern free from open failure after firing is formed.

Instead of such preliminary drying, by raising temperature from room temperature to 150° C. by a moderate temperature gradient of 15° C. /min or less, an inhibitory effect of formation of pin holes may be also obtained.

If, incidentally, the Ag paste 24 in the groove 21 or pit 22 is cured by drying at the step 240, its flexibility is likely to be lost. As a result, when transferring the conductor pattern having a fine line width (for example, 100 µm or less), cracks may be formed in the Ag paste 24 due to stress occurring at the time of transfer, which may lead to occurrence of open failure when firing. To avoid such inconvenience, it is preferred to add 0.1 to 10 wt. % of plasticizer in the Ag paste 24. Hence, the Ag paste 24 has an adequate flexibility after drying, and crack in the transfer step can be prevented. As the plasticizer, it is preferred to use a plasticizer of ester phthalate, for example, dimethyl phthalate, diethyl phthalate, or dioctyl phthalate.

After the drying step 240, the volume of the Ag paste 24 charged inside the groove 21 and pit 22 is decreased by the portion corresponding to the evaporation of the organic solvent. To compensate for this volume decrease, accordingly, the filling step and drying step of the Ag paste 24 are repeated once more. The Ag paste 24 once cured by evaporation of the organic solvent in the preceding drying step 240 is softened again at this refilling step. By this refilling step 250 and re-drying step 260, the shape of the charged Ag paste 24 is further adjusted, and the thickness of the Ag paste 24 may be made equal to the depth of the groove 21 and pit 22 of the intaglio 20.

In the non-pattern forming portion of the intaglio 20, in particular, between grooves 21, if the Ag paste 24 is left over, it may cause short-circuit failure between lines of the conductor pattern. Such residue of Ag paste 24 occurs because the Ag paste 24 is viscous and stringy, and stringiness occurs during the scratching operation by the squeegee 25, so that the Ag paste 24 is left over in the portion to be removed. However, at the refilling step 250, if refilled while the Ag paste 24 in dry state is present in the groove 21 and pit 22, the solvent of the Ag paste 24 newly applied in the non-pattern forming portion is absorbed by the dry paste in the groove 21 or pit 22, and the viscosity of the Ag paste left over in the non-pattern forming portion is increased. As a result, stringiness does not occur when removing the Ag paste 24 in the non-pattern forming portion by the squeegee, and the residual paste in this portion can be easily removed. Thus, a conductor pattern without short-circuit failure between the lines can be obtained.

In this embodiment, the refilling step 250 and re-drying step 260 are repeated once each, but they may be repeated twice or more as required.

Consequently, a water-soluble resin 28 is formed on the insulating substrate 2. This water-soluble resin 28 functions as adhesion layer when frozen at the time of transfer. As schematically shown in FIG. 6, the surface of the intaglio 20 of the side of the groove 21 and pit 22 filled with Ag paste 24 is set opposite to the water-soluble resin 28, and the intaglio 20 and insulating substrate 2 are adhered together while applying pressure (step 270). The adhering device is in a structure of surrounding a pressing portion 26 of a press device by a freezing device 27 as shown in FIG. 6.

The applied pressure is preferred to be set in a range from the lower limit pressure of 1 kg/cm$^2$ to the upper limit pressure for causing crack of the insulating substrate 2. If the pressure is smaller than the lower limit value, when the surface of the insulating substrate 2 is corrugated, the intaglio 20 and insulating substrate 2 are not fitted perfectly when adhering, and bubbles may get in between them. Such phenomenon may lead to transfer failure.

Considering this result of investigation, in the embodiment, the laminating step 270 is conducted in the following condition. First, the water-soluble resin 28 dissolving polyvinyl alcohol (PVA) is applied on the surface of a 100 mm square alumina-made insulating substrate 2. An optimum concentration of the water-soluble resin 28 is in a range of 1 to 50 wt. % depending on the kind of resin, and 15% was optimum concentration for PVA. Next, the insulating substrate 2 thus coated with water-soluble resin 28 of PVA, and the intaglio 20 filled with Ag paste 24 are adhered together in the condition of temperature of −40° C. and pressure of 20 kg/cm$^2$ by using the press device in a structure of surrounding the pressing portion 26 with the freezing device 27. In this embodiment, the water-soluble resin 28 is applied on one side only of the insulating substrate 2 and only one side is adhered, but the water-soluble resin 28 may be applied on both sides of the insulating substrate 2, and both sides may be adhered.

Usually, the surface of the insulating substrate 2 has corrugations of about 30 µm in maximum width as schematically shown in FIG. 7 (a) or FIG. 7 (b). In the case of the conventional glass intaglio 29 shown in FIG. 7 (b), since the rigidity of the glass intaglio 29 is too strong, the intaglio 29 cannot sufficiently follow up the corrugated shape of the insulating substrate 2. Hence, the thickness of the water-soluble resin 28' must be made non-uniform at about 10 to 50 µm, and lamination must be executed by absorbing the corrugation. As a result, due to uneven film thickness of the water-soluble resin 28', partial pattern deformation occurs. On the other hand, in the case of the flexible resin intaglio 20 as in this invention, as shown in FIG. 7 (a), the intaglio 20 can sufficiently follow up the corrugated shape of the insulating substrate 2. Therefore, regardless of the corrugated shape of the insulating substrate 2, the water-soluble resin 28 of uniform film thickness can be formed on the insulating substrate 2, and partial pattern deformation due to uneven film thickness can be avoided.

Next, as transfer step 280, the laminated intaglio 20 and insulating substrate 2 are set below 0° C. temperature so that the water-soluble resin 28 may be frozen, and in this state the intaglio 20 is peeled off from the insulating substrate 2, and the Ag paste 24 is adhered to the insulating substrate 2 by the cohesive force of ice, and the conductor pattern is transferred. At this time, since the intaglio 20 is rich in flexibility, as shown in FIG. 8, the intaglio 20 can be bent at an angle of 90° or more. As a result, peeling of the intaglio 20 from the insulating substrate 2 is peeling of surface and line. Accordingly, the required peeling force is decreased, so that the intaglio 20 can be peeled off easily. On the other hand, in the case of the conventional rigid glass intaglio 29 (see FIG. 7 (b)), the intaglio 29 cannot be bent to the angle as shown in FIG. 8. It is therefore peeling of surface and surface, and a large peeling force is needed. Or if the bending angle of the intaglio 29 is too large, cracks may be easily formed in the intaglio 29 or insulating substrate 2. In the conventional case, therefore, greater care is needed in peeling of the two, the working efficiency is poor, which caused to increase the working cost and working time.

In the transfer step of the invention, if using the intaglio 20 having a pattern of, for example, groove width of 15 µm and depth of 20 µm, the Ag paste 24 is not left over inside the groove 21, and the conductor pattern having the width substantially same as the width of the groove 21 and the height substantially same as the depth of the groove 21 can be transferred and formed. In the viahole electrode portion, when the diameter of the pit 22 of the intaglio 20 is 45 µm and the depth is 60 µm, same as in the case of the groove 21, the conductor pattern of the dimensions substantially corresponding completely can be transferred and formed. Besides, since the conductor line and via-hole electrode are integrally formed at the same time in the same process, the electrical connection of the two is securely assured.

Moreover, in the case of the electronic component used in high frequency region such as the chip inductor 1 for high frequency in the embodiment, the surface shape of the conductor pattern must be as sharp as possible in order to decrease the superficial resistance and enhance the electrical operation characteristic. However, in the wet etching process used in forming the conventional steel plate or glass intaglio, processing of high aspect ratio is impossible because of isotropic etching. Accordingly, as the pattern becomes fine and the forming line width is narrow, deep groove cannot be formed. Besides, the groove edge is not sharp but is round. By contrast, by processing the intaglio 20 by excimer laser as in the invention, a pattern having sharp edges can be formed. As already explained, moreover, since the Ag paste 24 is not left over in the groove 21 or pit 22 at the time of transfer, a pattern having a sharp shape same as the shape of the acute intaglio 20 can be formed. Therefore, the conductor pattern of the embodiment has excellent properties as the conductor for high frequency.

Next, after peeling off the intaglio 20 at temperature of 0° C. or less, drying is conducted by a dryer at temperature of 150° C. At this time, the moisture in the water-soluble resin 28 is evaporated rapidly, and the adhesion layer becomes an adhesion layer of a minimum required limit of 1 µm or less for fixing the Ag paste 24 in the insulating substrate 2.

In the process using the conventional thermoplastic resin or thermosetting resin, in order to transfer from the intaglio, the film thickness of the adhesion layer was required by 4 µm or more. Accordingly, in the later process of firing, thermal changes of adhesion layer, or peeling or deformation leading to defect of conductor pattern by combustion gas took place. In the invention, however, since a strong adhesion force is needed in the peeling stage, the cohesive force by freezing the moisture in the water-soluble resin 28 is used, and in the firing stage, the moisture is evaporated, and therefore the film thickness of the adhesion layer can be set to the minimum required thickness for fixing the Ag paste 24 on the insulating substrate 2. As a result, peeling and deformation of the conductor pattern can be prevented at the time of firing. Of course, if the drying and firing steps after peeling the intaglio 20 and insulating substrate 2 are in a continuous process not causing deformation of the conductor pattern without fixing with the insulating substrate 2, it is not necessarily required to use water-soluble resin in the adhesion layer, and only water may be used.

As the material for the water-soluble resin 28 to be applied on the insulating substrate 2, it is preferred to use ethyl cellulose derivative thermoplastic resin, or epoxy or acrylic thermosetting resin. In particular, PVA, polyvinyl acetal, cellulose ether, methyl vinyl ether and maleic acid anhydride copolymer, and other water-soluble synthetic polymers are preferred, or natural water-soluble polymers such as gelatin and galactose are preferred. These materials can be easily frozen, and adhesion of the conductor pattern to the substrate is strong when firing after transferring to the substrate, and deformation of conductor pattern is less likely to occur.

According to such method of the invention, the lines 3 in the conductor pattern and the via-hole electrode 7 are integrally formed at the same time. Thus, secure electric connection between the lines 3 and the via-hole electrode 7 is achieved.

Next, to form an insulating layer 5 on the surface of the insulating substrate 2 forming the conductor pattern, a glass paste pattern is printed and formed (step 300). At this time, in the portion of the via-hole electrode 7, crystallized glass of viscosity of 200,000 cps is printed by using a screen plate of mask diameter of 150 µm. Consequently, in the portion of the via-hole electrode 7, printing blur occurs, and the thickness of the glass paste covering the periphery of the via-hole electrode 7 is thinner than in other portions. As a result, a portion of via-hole shape is formed around the via-hole electrode 7. Since the diameter of the via-hole to be formed is defined by the shape of the via-hole electrode 7, fine via-holes of about 40 µm in diameter hitherto difficult to form can be easily printed and formed. Moreover, since such fine via-holes can be formed, the number of turns of the spiral coil pattern can be increased by the corresponding portion. Hence, the inductance value of the obtained coil pattern can be increased.

Thus printed glass paste pattern is fired by holding at the peak temperature of 820° C. for 10 minutes, and the insulating layer 5 is formed. At this time, since crystallized glass is used, flowing during firing is less, and the printed pattern shape is maintained favorably.

In the conventional method, in order to mutually connect the conductor patterns of upper layer and lower layer of the substrate of multilayer structure, via-holes were formed in the insulating layer by patterning or etching by screen printing, and electrode materials were embedded to form via-hole electrodes. In this method, however, due to defect in the electrode embedding process, imperfect electrical connection between the conductor pattern of upper layer or lower layer and via-hole electrode may occur, and faulty connection may occur between the conductor pattern of lower layer and conductor layer of upper layer. In the method of the invention, however, as mentioned above, since the via-hole electrode 7 is formed integrally and simultaneously with forming of the conductor pattern of the lower layer, such defective connection does not occur.

Moreover, the shape and thickness of the via-hole electrode 7 can be set arbitrarily, and by projecting the via-hole electrode 7 by several microns from the surface of the insulating layer 5, the connection of the conductor pattern of the upper layer and the via-hole electrode 7 can be achieved securely. Still more, by forming trapezoidally in the sectional shape in the direction vertical to the surface of the insulating substrate 2 of the via-hole electrode 7, even if the via-hole electrode 7 is small in dimension, a sufficient connection strength necessary in the later process can be obtained.

Finally, a lead electrode 6 is formed on the insulating layer 5 at step 310. Herein, by Ag paste, the pattern of the lead electrode 6 is screen printed on the surface of the insulating layer 5, and it is formed by firing by holding at peak temperature of 810° C. for 10 minutes. As a result, the chip inductor 1 of the embodiment is manufactured.

So far is explained the manufacturing method of the electronic component of the embodiment by referring to an example of chip inductor 1, and, of course, such manufacturing method is not limited to the chip inductor 1. For example, the manufacturing method of the invention may be applied to manufacture of other electronic components such as chip beads, EMI filter and capacitor or electrode portion of other electronic components having laminate structure. In the preceding description, after transferring the conductor pattern by the manufacturing process of step 210 to step 290, the insulating layer 5 and lead electrode 6 are formed at step 300 and step 310. However, when forming a conductor pattern not requiring such structure, step 300 and step 310 are not necessary, and the desired conductor pattern may be obtained by step 210 to step 290.

As the material of the conductive paste used for forming the conductor pattern, Ag paste is used, but the invention is not limited to this alone. For example, other metal paste such as Cu, Ni, Al and Au, or resinate paste can be used. Aside from the conductive paste containing organic solvent, it is also possible to use conductive paste containing a proper flexible resin after curing with ultraviolet curing resin or thermosetting resin.

The material of the intaglio 20 is desired to have an adequate flexibility. For example, aside from the polyimide film 15 mentioned above, it is preferred also to use resin sheets such as PET, PSF, PC, PEI (polyether imide), PAR (polyacrylate), or PEEK (polyether ketone).

The material of the insulating substrate 2 as the forming object for transferring and forming the conductor pattern is not particularly limited, and ceramic and other general materials may be employed. By selecting dielectric material, magnetic material, or insulating material for the insulating substrate, various different electronic components may be fabricated. Or, by using the material formed from green sheet as the insulating substrate 2, the parts structure becomes rational.

When forming an inductance part, it is preferred to form at least one of the insulating substrate 2 and insulating layer 5 by using a magnetic material such as ferrite. This is because the inductance value of the formed electronic components can be enhanced by the permeability of these magnetic materials. When composing the capacitor or the like, it is preferred to use a dielectric material. Hence, the capacitance is increased.

For formation of the intaglio 20, it is preferred to the excimer laser device 11, but as far as capable of generating laser beam at the wavelength in the ultraviolet ray region, other laser source such as pigment laser and free electron laser may be used. Moreover, if the light source can generate a beam having an energy density of the necessary level equivalent to these lasers in the same wavelength region, others than the laser light source may be also used.

A second embodiment of manufacturing method of the electronic component in the invention is described below in FIG. 10 through FIG. 13 by referring to an example of manufacturing method of hybrid IC (hereinafter called HIC) substrate having a laminate structure of conductor pattern. In FIG. 10 through FIG. 13, same constituent elements are identified with same reference numerals.

FIG. 10 (a) is a plan view of an HIC substrate 30, and FIG. 10 (b) is a cut sectional view of the HIC substrate 30 along line 11B—11B in FIG. 10 (a). The right half of FIG. 10 (a) shows the portion of forming the second conductor pattern of the upper layer, and the left half shows the portion of forming the first conductor pattern of the lower layer. Incidentally, FIG. 10 (a) and FIG. 10 (b) show the constitution of the HIC substrate 30 simply and schematically, and the conductor pattern in the drawing does not show the following dimensions correctly.

The HIC substrate 30 has a two-layer wiring structure consisting of a first conductor pattern 32 as the lower layer formed on an insulating substrate 31, an insulating layer 33 formed to cover the first conductor pattern, and a second conductor pattern 34 as the upper layer formed on the insulating layer 33. The first conductor pattern 32 comprises a spiral coil conductor portion 32a and other conductor portion 32b as shown in FIG. 10 (b). The first conductor pattern 32 and second conductor pattern 34 are connected by a via-hole electrode 35. In part of the first conductor pattern 34, a mounting portion 36 for face-down mounting of the IC chip is provided.

Of the first conductor pattern 32, in the portion corresponding to the coil conductor portion 32a, from the viewpoint of electrical characteristic, a conductor pattern is formed, for example, at a pitch of 60 µm (that is, width of 30 µm of each line and line interval of 30 µm) and a height (that is, thickness of conductor film) of 35 µm. The via-hole electrode 35 is formed in a height (that is, thickness of conductor film) of 50 µm, so that the leading end may project from the surface of the insulating layer 33 and the conductor patterns 32 and 34 of upper and lower layers may be connected securely. On the other hand, the face-down mounting portion 36 of the second conductor pattern 34 is formed, for example, in a pitch of 150 µm (that is, width of 75 µm of each line, and line interval of 75 µm). Moreover, this face-down mounting portion 36 is required to have a flatness so that the corrugation per surface length of 5 mm should be 3 µm or less, from the mounting condition restriction of the face-down mounting of the IC chip. In this case, of the first conductor pattern, if the height (thickness of the conductor film) of the conductor portion 32b positioned beneath the face-down mounting portion 36 is 5 µm or more, the surface corrosion of the insulating layer 33 becomes large, and face-down mounting is difficult. Accordingly, the height of the conductor portion 32b is limited below 5 µm.

Thus, in the second embodiment of the invention, of the formed conductor patterns, the thickness (line height) of the conductor film in an arbitrary position is changed to a desired value, and a conductor pattern having a height difference is formed in the pattern. As a result, the HIC substrate 30 realizing face-down mount of IC chip at a specified position of the second conductor pattern 34 on the surface is formed.

The manufacturing method of the HIC substrate 30 of the embodiment is described below. Meanwhile, the individual steps for manufacturing the intaglio differ only in the shape of the conductor pattern as the forming object, but are substantially equivalent to the corresponding steps in the first embodiment. Therefore, descriptions about their features and the like are omitted herein.

First, the intaglio for forming the first conductor pattern 32 is formed on the polyimide film in the following procedure by using excimer laser, same as in step 210 of the first embodiment, by using three masks, that is, the mask for forming the coil conductor portion 32a of the first conductor pattern 32, the mask for forming the other conductor portion 32b, and the mask for forming the via-hole electrode 35. First, using the mask corresponding to the pattern of the coil conductor portion 32a, a pattern corresponding to the coil conductor 32a composed of a groove of 45 μm in depth is formed. Then, using the mask corresponding to the pattern of the via-hole electrode 35, a pattern corresponding to the via-hole electrode composed of a groove of 65 μm in depth is formed. Finally, using the mask corresponding to the pattern of the conductor portion 32b, a pattern corresponding to the conductor portion 32b composed of a groove of 10 μm in depth is formed. By positioning the relative positions of the individual patterns formed in these steps at a precision of within 5 μm, the intaglio for forming the first conductor pattern 32 is formed.

On thus formed intaglio, same as in step 220, a peeling layer composed of fluorocarbon monomolecular film is formed. Then, same as in step 230, each groove of the intaglio is filled with Ag paste by using a ceramic squeegee. Later, same as in step 240, the Ag paste is dried by the circulation hot air type dryer. The organic solvent contained inside is evaporated, and the internal paste of the grooves of the intaglio is decreased by the volume corresponding to the evaporation amount. Moreover, same as in step 250 and step 260, after refilling with Ag paste, drying is executed in two stages. In this way, by repeating paste filling and drying steps same as in the first embodiment, the thickness of the Ag paste film is made substantially equal to the depth of each groove.

Then, same as in step 270, the water-soluble resin is applied on the surface of the insulating substrate 31, and the intaglio and insulating substrate 31 are adhered at pressure of 25 kg/cm$^2$ and substrate temperature of −40° C. Consequently, same as in step 280, the intaglio is peeled off while keeping the substrate temperature below 0° C., the conductor pattern is transferred onto the insulating substrate 31, and dried by a dryer at temperature of 150° C. Further, same as in step 290, the insulating substrate 31 on which the conductor pattern is transferred is fired by raising temperature at a temperature gradient of 30° C. /min up to peak temperature of 850° C.

In this series of steps, same as in the first embodiment, the first conductor pattern 32 and via-hole electrode 35 are integrally and simultaneously formed.

Same as in step 300, consequently, a pattern of insulating layer 33 is formed on the insulating substrate 31 by screen printing of color paste. Firing at temperature of 840° C., the insulating layer 33 is formed. At this time, by using crystallized glass same as in the first embodiment, flowing of glass paste is less during firing, and the shape formed by screen printing is held relatively well.

After forming the insulating layer 33, a pattern corresponding to the second conductor pattern 34 is formed by screen printing of Ag paste. The second conductor pattern 34 is formed by firing for keeping at peak temperature of 810° C. for 10 minutes.

In this way, by increasing the height of the line (thickness of the conductor film) in the portion corresponding to the spiral coil conductor portion 32a of the conductor pattern, a coil excellent in electric characteristic is formed same as in the first embodiment. Besides, by forming the section in the direction vertical to the substrate surface of the via-hole electrode 35 in a trapezoidal form, the electric connection between the second conductor pattern 34 and first conductor pattern 32 may be made securely. Still more, by reducing the thickness of the first conductor pattern 32 selectively at desired positions, the surface of the insulating layer 33 can be flattened as necessary positions. As a result, the IC substrate 30 capable of mounting the IC chip with the face down is manufactured.

The shape of the via-hole electrode 35 is not limited to the shape shown in FIG. 10 (b). For example, as in an HIC substrate 40 shown in FIG. 11, an electrode 35' may be formed to fill only a part of the via-hole. Or, by forming a via-hole when forming the insulating layer 33, so that the first conductor pattern 32 may not be completely covered by the insulating layer 33, the electrode for connecting the first conductor pattern 32 and second conductor pattern 34 may be provided in the via-hole in other step than the step of forming the first conductor pattern 32.

The above explanation relates to an example of two-layer wiring substrate, but a further multiple-layer structure may be also formed. For example, in an HIC substrate 50 shown in FIG. 12, conductor patterns 51, 52, 53 corresponding to pattern of one layer of HIC substrates 30 and 40 shown in FIG. 10 (b) and FIG. 11 are laminated in three layers on the insulating substrate 31. Moreover, since a height difference may be formed on the line of the conductor pattern, it is also possible to form an HIC substrate 60 having a surface shape of insulating layer 33 as shown in FIG. 13. In the HIC substrate 60, of the lower layer conductor pattern, the conductor portion 32a corresponding to the portion where control of surface corrugated shape of the insulating layer 33 is not necessary is formed by a relatively high line (a thick conductor film). On the other hand, the conductor portion 32b corresponding to the portion necessary for flattening the surface of the insulating layer 33, such as the portion for face-down mounting of an IC chip 61 is formed by a relatively low line (a thin conductor, film). As the height of the conductor 32b drops, the conductor resistance increases, but by increasing the line width of the conductor 32b as required, adverse effects on electrical characteristics can be suppressed. Thus, according to the invention, considering the trade-off of the request for surface shape of the insulating layer 33 and the request for electrical characteristic of the conductor pattern, an optimum shape of conductor pattern can be obtained.

As clear from the description herein, according to the manufacturing method of the electronic components of the invention, the intaglio is manufactured by forming the groove pattern corresponding to the conductor pattern to be formed on the surface of the resin sheet rich in flexibility by irradiation with excimer laser. The conductive paste to be applied in the groove pattern of the intaglio is completely transferred substantially on the substrate as the forming object. Besides, since the shape of the groove to be formed in the intaglio may be made sharp, the shape of the conductor pattern formed by firing after transfer may be also a desired actuate rectangular shape. As a result, the electric characteristic of the formed conductor pattern is improved.

In the aspect of the size, it is possible to form fine and thick conductor pattern with the line width of conductor pattern of 10 μm or less and the thickness of conductor film of 5 μm or more. It is also possible to increase the thickness of the conductor film only in desired positions, that is, the line of the conductor pattern can be heightened. By applying these points, according to the manufacturing method of the electronic components of the invention, it is possible to form fine via-holes with the width being substantially same as the size of the fine conductor pattern. Therefore, the electronic components having small and laminate structure difficult to realize by the conventional printing method can be manufactured at low cost.

In the description of the first and second embodiments, the invention is explained by referring to examples of electronic components in which it is required to form a thick portion of conductor film in the conductor pattern, but the invention is not limited to these embodiments alone. For example, in other electronic components, that is, in electronic components not required to be partially different or greater in the thickness of the conductor film, evidently, the manufacturing method of electronic components of the invention can be applied. Even in such case, peeling is easy and secure in the transfer step by the using of the intaglio formed from a flexible resin sheet, and the pattern of shape rectangular form can be formed by pattern forming on the intaglio by excimer laser, which are sufficiently effective improving means for the characteristics of the electronic components to be manufactured. Therefore, modified examples existing within the true spirit and scope of the invention should be all included in the scope of the claims thereof.

What is claimed is:

1. A method of manufacturing an electronic component including a conductor pattern on a substrate, comprising the steps of:
   fabricating an intaglio by forming a groove pattern corresponding to a conductor pattern on a surface of a flexible resin;
   filling a groove of the groove pattern with conductive paste;
   drying the applied conductive paste;
   adhering together the intaglo and substrate, by overlaying the intaglio and the substrate through either one of water and water-soluble resin, and freezing either one of water and water-soluble resin by applying temperature in a predetermined range and pressure in a predetermined range;
   transferring a pattern of the conductive paste on the substrate by peeling the intaglo from the substrate in frozen state; and
   forming a conductor pattern by firing the transferred pattern of the conductive paste.

2. A method of manufacturing an electronic component of claim 1, further comprising the steps of:
   forming a peeling layer on the surface of the intaglio for the ease of peeling of the substrate and intaglio; and
   repeating a step of refilling with additional conductive paste for compensating for the volume decrease of the conductive paste decreased by the drying step, and a step of re-drying the conductive paste after refilling, by a specific number of times.

3. A method of manufacturing an electronic component of claim 1, wherein part of the groove is formed deeper than other parts so as to vary the height of the conductor pattern partly.

4. A method of manufacturing an electronic component of claim 1, wherein the groove has a sectional shape with a taper angle at the side.

5. A method of manufacturing an electronic component of claim 1, wherein laser having an oscillation frequency in ultraviolet region is used when forming the groove.

6. A method of manufacturing an electronic component of claim 5, wherein the laser is excimer laser.

7. A method of manufacturing an electronic component of claim 1, wherein the peeling layer is composed of a monomolecular film of fluorocarbon compound.

8. A method of manufacturing an electronic component of claim 1, wherein the conductive paste contains a plasticizer.

9. A method of manufacturing an electronic component of claim 1, wherein the water-soluble resin is composed of one selected from the group consisting of PVA, polyvinyl acetal, cellulose ether, methyl vinyl ether and maleic acid anhydride copolymer, gelatin, and galactose.

10. A method of manufacturing an electronic component of claim 1, wherein the substrate is an insulating substrate composed of any one of dielectric material, magnetic material, and insulating material.

11. A method of manufacturing an electronic component of claim 1, wherein the substrate is formed of a green sheet.

12. A method of manufacturing an electronic component including a conductor pattern on a substrate, comprising the steps of:
   fabricating an intaglio by forming a groove pattern corresponding to a conductor pattern on a surface of a flexible resin;
   filling a groove of the groove pattern with conductive paste;
   drying the applied conductive paste;
   adhering together the intaglio and substrate, by overlaying the intaglio and the substrate through either one of water and water-soluble resin, and freezing either one of water and water-soluble resin by applying temperature in a predetermined range and pressure in a predetermined range;
   transferring a pattern of the conductive paste on the substrate by peeling the intaglio from the substrate in frozen state;
   forming a first conductor pattern by firing the transferred pattern of the conductive paste;
   forming an insulating layer for covering at least part of the first conductor pattern;
   forming a second conductor pattern on a surface of the insulating layer; and
   forming an electrode in an exposed portion of the first conductor pattern from the insulating layer, for electrically connecting the first conductor pattern and second conductor pattern.

13. A method of manufacturing an electronic component of claim 12, further comprising the steps of:
   forming a peeling layer on the surface of the intaglio for the ease of peeling of the substrate and intaglio; and
   repeating a step of refilling with additional conductive paste for compensating for the volume decrease of the conductive paste decreased by the drying step, and a step of re-drying the conductive paste after refilling, by a specific number of times.

14. A method of manufacturing an electronic component of claim 12, wherein a portion formed in a greater height of the first conductor pattern is used as the electrode.

15. A method of manufacturing an electronic component of claim 14, wherein a portion of the first conductor pattern corresponding to a portion for forming a flat part on the surface of the insulating layer is formed in a lower height.

16. A method of manufacturing an electronic component of claim 15, further comprising a step of mounting an IC chip with face down in the flat part of the surface of the insulating layer.

17. A method of manufacturing an electronic component of claim 12, wherein the insulating layer is composed of one of magnetic material and dielectric material.

18. A method of manufacturing an electronic component of claim 12, wherein part of the groove is formed deeper than other parts so as to vary the height of the first conductor pattern partly.

19. A method of manufacturing an electronic component of claim 12, wherein the groove has a sectional shape with a taper angle at the side.

20. A method of manufacturing an electronic component of claim 12, wherein laser having an oscillation frequency in ultraviolet region is used when forming the groove.

21. A method of manufacturing an electronic component of claim 20, wherein the laser is excimer laser.

22. A method of manufacturing an electronic component of claim 12, wherein the peeling layer is composed of a monomolecular film of fluorocarbon compound.

23. A method of manufacturing an electronic component of claim 12, wherein the conductive paste contains a plasticizer.

24. A method of manufacturing an electronic component of claim 12, wherein the water-soluble resin is composed of one selected from the group consisting of PVA, polyvinyl acetal, cellulose ether, methyl vinyl ether and maleic acid anhydride copolymer, gelatin, and galactose.

25. A method of manufacturing an electronic component of claim 12, wherein the substrate is an insulating substrate composed of any one of dielectric material, magnetic material, and insulating material.

26. A method of manufacturing an electronic component of claim 12, wherein the substrate is formed of a green sheet.

* * * * *